(12) United States Patent
Wang et al.

(10) Patent No.: US 11,975,961 B2
(45) Date of Patent: May 7, 2024

(54) MEMS PACKAGE WITH SHOCK AND VIBRATION PROTECTION

(71) Applicant: Beijing Voyager Technology Co., Ltd., Beijing (CN)

(72) Inventors: Youmin Wang, Mountain View, CA (US); Anan Pan, Fremont, CA (US); Henghui Jiang, Newark, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 951 days.

(21) Appl. No.: 16/945,265

(22) Filed: Jul. 31, 2020

(65) Prior Publication Data
US 2022/0033253 A1    Feb. 3, 2022

(51) Int. Cl.
| | | |
|---|---|---|
| *B81B 7/00* | (2006.01) | |
| *B81C 1/00* | (2006.01) | |
| *G01S 7/481* | (2006.01) | |
| *G01S 7/483* | (2006.01) | |
| *G01S 17/10* | (2020.01) | |

(52) U.S. Cl.
CPC .......... *B81B 7/0058* (2013.01); *B81B 7/0067* (2013.01); *B81C 1/00317* (2013.01); *G01S 7/4811* (2013.01); *G01S 7/483* (2013.01); *G01S 17/10* (2013.01); *B81B 2201/042* (2013.01); *B81B 2207/098* (2013.01)

(58) Field of Classification Search
CPC ............ B81C 1/00261; B81C 1/00301; B81C 1/00317; B81C 1/00325; B81B 7/0058; G01S 7/4814; G01S 7/4817
See application file for complete search history.

(56) References Cited

U.S. PATENT DOCUMENTS

| | | | | |
|---|---|---|---|---|
| 6,028,351 | A * | 2/2000 | Klonis | H01L 23/10 257/688 |
| 9,340,409 | B1 * | 5/2016 | Gurin | B81B 7/0048 |
| 2006/0128058 | A1 * | 6/2006 | Dungan | B81C 1/0023 438/106 |
| 2014/0078766 | A1 * | 3/2014 | Giametta | B60Q 1/0052 362/516 |
| 2018/0180722 | A1 * | 6/2018 | Pei | G01S 7/497 |
| 2019/0064364 | A1 * | 2/2019 | Boysel | G05D 1/0231 |
| 2020/0361370 | A1 * | 11/2020 | Wescott | B60Q 5/006 |

FOREIGN PATENT DOCUMENTS

CN          101613073 A  * 12/2009  ........... B81B 7/0006

* cited by examiner

*Primary Examiner* — Eric L Bolda
(74) *Attorney, Agent, or Firm* — Kilpatrick Townsend & Stockton LLP

(57) ABSTRACT

An optical micro-electromechanical system (MEMS) system is disclosed. The optical MEMS system includes a printed circuit board (PCB), and a MEMS optical integrated circuit (IC) package mounted to the PCB. The IC package includes a MEMS optical die, and a plurality of leads electrically and mechanically connected to the MEMS optical die and to the PCB. The optical MEMS system also includes one or more elastomeric grommets contacting one or more of the leads, where the grommets are configured to absorb mechanical vibration energy from the contacted leads.

17 Claims, 8 Drawing Sheets

MEMS PACKAGE WITH SHOCK AND VIBRATION PROTECTION

BACKGROUND

Modern vehicles are often fitted with a suite of environment detection sensors that are designed to detect objects and landscape features around the vehicle in real-time that can be used as a foundation for many present and emerging technologies such as lane change assistance, collision avoidance, and autonomous driving capabilities. Some commonly used sensing systems include optical sensors (e.g., infra-red, cameras, or other suitable device.), radio detection and ranging (RADAR) for detecting presence, direction, distance, and speeds of other vehicles or objects, magnetometers (e.g., passive sensing of large ferrous objects, such as trucks, cars, or rail cars), and light detection and ranging (LiDAR).

LiDAR typically uses a pulsed light source and a light detection system to estimate distances to environmental features (e.g., vehicles, structures, or other suitable device.). In some systems, the light source can be steered in a repeating scanning pattern across a region of interest to form a collection of points that are dynamically and continuously updated in real-time, forming a "point cloud." The point cloud data can be used to estimate, for example, a distance, dimension, and location of an object relative to the LiDAR system, often with very high fidelity (e.g., within 5 cm).

Because the environment is typically mechanically noisy, each component experiences significant vibration and shock. Improvements in protection against vibration and shock are needed in the art at least so that the mechanical forces generated on the component by the shock and vibration are reduced.

BRIEF SUMMARY

One inventive aspect is an optical micro-electromechanical system (MEMS) system. The optical MEMS system includes a printed circuit board (PCB), and a MEMS optical integrated circuit (IC) package mounted to the PCB. The IC package includes a MEMS optical die, and a plurality of leads electrically and mechanically connected to the MEMS optical die and to the PCB. The optical MEMS system also includes one or more elastomeric grommets contacting one or more of the leads, where the grommets are configured to absorb mechanical vibration energy from the contacted leads.

In some embodiments, the grommets further contact the IC package and the PCB, and where the grommets are further configured to absorb mechanical vibration energy from the IC package and the PCB.

In some embodiments, at least one of the grommets contacts a plurality of leads.

In some embodiments, at least one of the grommets includes one or more holes, where each hole surrounds one of the leads.

In some embodiments, the optical MEMS package further includes an elastomeric pad contacting the IC package and the PCB, where the pad is configured to absorb mechanical vibration energy from the IC package and the PCB.

In some embodiments, the grommets are spaced apart from the pad.

In some embodiments, the grommets contact the pad.

In some embodiments, the grommets are formed by a portion of the pad.

Another inventive aspect is a LiDAR system. The LiDAR system includes a pulsed light source, including a printed circuit board (PCB), a MEMS integrated circuit (IC) package mounted to the PCB. The IC package includes a MEMS optical die sensitive to mechanical vibration and configured to provide pulsed light. The LiDAR system also includes a plurality of leads electrically and mechanically connected to the PCB, and one or more elastomeric grommets contacting one or more of the leads, where the grommets are configured to absorb mechanical vibration energy from the contacted leads. The LiDAR system also includes a light detector configured to detect light from the pulsed light source.

In some embodiments, the grommets further contact the IC package and the PCB, and the grommets are further configured to absorb mechanical vibration energy from the IC package and the PCB.

In some embodiments, at least one of the grommets contacts a plurality of leads.

In some embodiments, at least one of the grommets includes one or more holes, where each hole surrounds one of the leads.

In some embodiments, the LiDAR system further includes an elastomeric pad contacting the IC package and the PCB, where the pad is configured to absorb mechanical vibration energy from the IC package and the PCB.

In some embodiments, the grommets are spaced apart from the pad.

In some embodiments, the grommets contact the pad.

In some embodiments, the grommets are formed by a portion of the pad.

Another inventive aspect is a method of manufacturing an optical micro-electromechanical system (MEMS) system. The method includes placing a MEMS optical integrated circuit (IC) package on a printed circuit board (PCB), the IC package including a MEMS optical die, and a plurality of leads electrically and mechanically connected to the MEMS optical die. The method further includes placing one or more elastomeric grommets on the PCB, and causing the grommets to contact one or more of the leads, where the grommets are configured to absorb mechanical vibration energy from the contacted leads.

In some embodiments, placing the MEMS optical IC package on the PCB includes placing the grommets on the PCB.

In some embodiments, placing the MEMS optical IC package on the PCB causes the grommets to contact one or more of the leads.

In some embodiments, the method further includes placing a pad between the MEMS optical IC package and the PCB, where the pad contacts the MEMS optical IC package and the PCB.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

The detailed description is set forth with reference to the accompanying figures.

DETAILED DESCRIPTION

Aspects of the present disclosure relate generally to MEMS packages used, for example, in automotive object and environment detection systems, and more particularly to LiDAR systems, according to certain embodiments.

Figure 2:
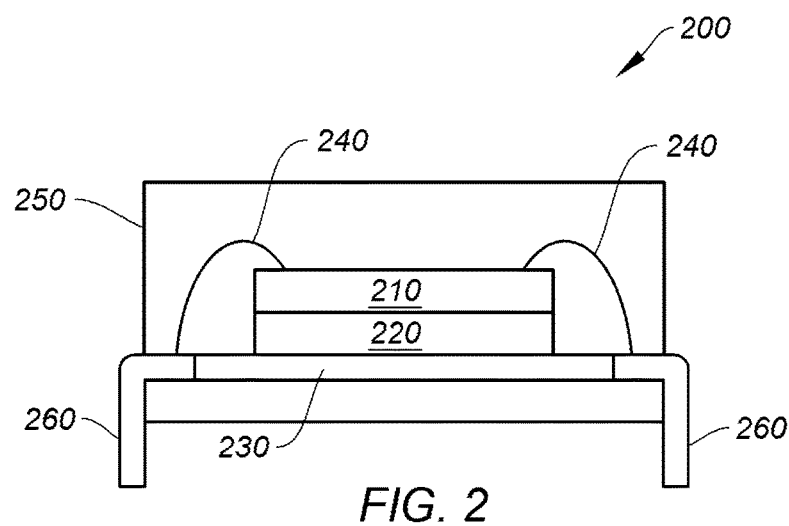
FIG. 2 is a simplified cross-sectional view of a MEMS integrated circuit (IC) package, according to certain embodiments of the invention.

As discussed in further detail below, the MEMS packages have mechanical shock and vibration absorption materials to protect the MEMS devices within the package from interference and/or damage which would otherwise cost by the mechanical shock and vibration. For example, FIGS. 2 and 11 illustrate embodiments where optical MEMS die which are mounted to a package using a mechanical shock and vibration absorbing material. In addition, FIGS. 3A, 3B, 4, 12, and 13 illustrate embodiments where MEMS packages are mounted to PCBs with mechanical shock and vibration absorbing grommets around one or more of their leads. Furthermore, FIGS. 5, 6, 14, and 15 illustrate embodiments where MEMS packages are mounted to PCBs with mechanical shock and vibration absorbing pads between the MEMS packages and the PCBs. FIGS. 7-10 and 16-19 illustrate embodiments where MEMS packages are mounted to PCBs with both mechanical shock and vibration absorbing grommets around one or more of their leads and mechanical shock and vibration absorbing pads between the MEMS packages and the PCBs.

In the following description, various examples of optical micro-electromechanical systems (MEMS) packaged circuits that can be used, for example, for LiDAR-based systems are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

The following high level summary is intended to provide a basic understanding of some of the novel innovations depicted in the figures and presented in the corresponding descriptions provided below. Aspects of the invention relate to an IC package configuration which is particularly effective at protecting the IC from mechanical vibration and shock.

Figure 1:
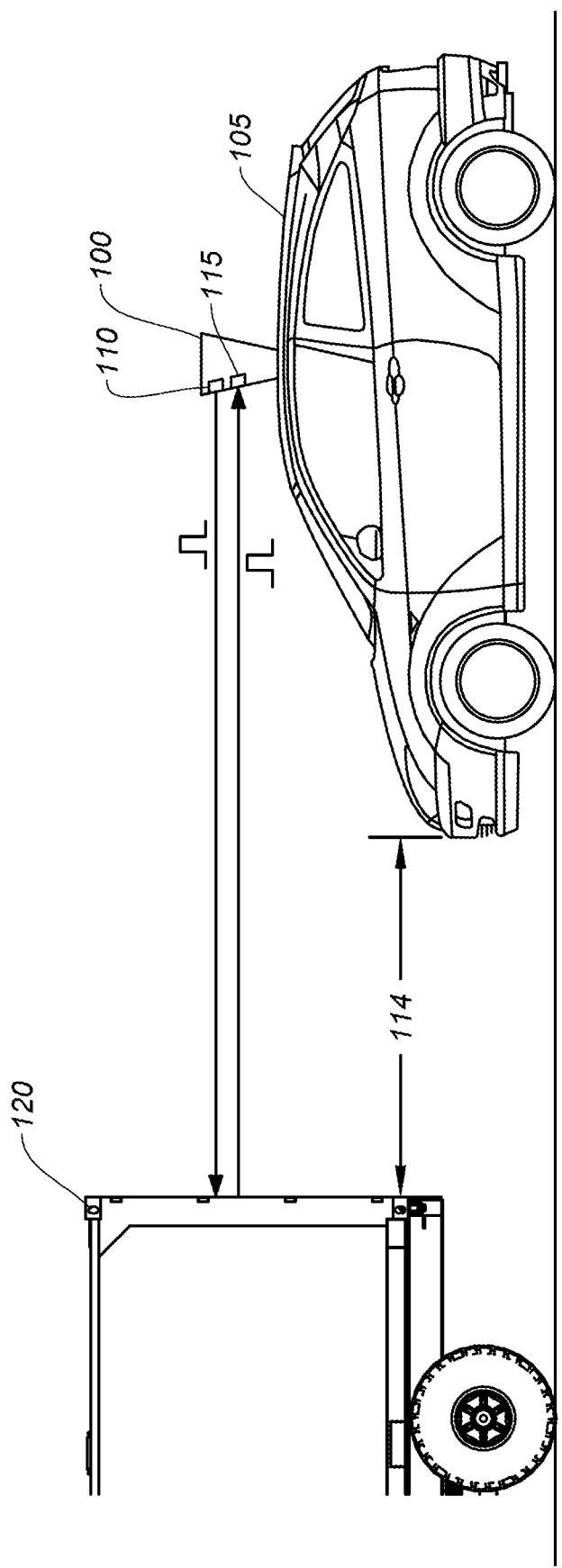
FIG. 1 illustrates an autonomous driving vehicle, according to certain embodiments of the invention.

As an illustrative example, FIG. 1 depicts a LiDAR-based system 100 mounted on a vehicle 105 (e.g., automobile, unmanned aerial vehicle, or other suitable device.). LiDAR system 100 may use a pulsed light LiDAR source 110 (e.g., focused light, lasers, or other suitable device.) and detection system 115 to detect external objects and environmental features (e.g., vehicle 120, structures, or other suitable device.), determine a vehicle's position, speed, and direction relative to the detected external objects, and in some cases may be used to determine a probability of collision, avoidance strategies, or otherwise facilitate certain remedial actions.

LiDAR source 110 may employ a light steering system, that includes a mirror that steers a pulsed light source also called a LiDAR beam, and that is packaged according to one or more embodiments discussed herein. In some embodiments the mirror is manipulable and sequentially steers the LiDAR beam in a scan and repeat pattern across a large area to detect obstacles around the vehicle and to determine distances between the obstacles and the vehicle. The mirror can be part of a MEMS device that enables the mirror to be rotated about one or more axes (e.g., tilted). Because the instantaneous position of the mirror is important, to protect the mirror from movement caused, for example, by vibration or shock, the mirror may be packaged according to one or more embodiments discussed herein at least so that the mechanical forces generated on the mirror by the mechanical shock or vibration waves are reduced.

As the mirror is rotated to steer the LiDAR beam, knowledge of the mirror's position can be used to determine the direction the reflected LiDAR beam is pointing, as known by those of skill in the art.

FIG. 2 is a simplified cross-sectional view of a MEMS integrated circuit (IC) package 200, according to certain embodiments of the invention. The MEMS IC may, for example, include a mirror for the LiDAR-based system 100 (see FIG. 1). For example, because of its robustness against shock and vibration, and because of the sensitivity of optical components, such as the mirror discussed above, to shock and vibration, MEMS package 200 can be particularly effectively used to form a portion of a LiDAR source, such as source 110 illustrated in FIG. 1.

MEMS package 200 includes MEMS die 210 attached to lead frame 230 with die attach 220. Lead frame 230 includes leads 260 which are electrically connected with MEMS die 210 with bond wires 240. In addition, lead frame 230, die attach 220, MEMS die 210, and bond wires 240 are encased in packaging material 250. MEMS package 200 may be considered to have a body 205 comprising MEMS die 210, die attach 220, lead frame 230, bond wires 240, and packaging material 250.

In some embodiments, die 210 includes an optical component, for example, to be used as a portion of a LiDAR source, such as source 110 illustrated in FIG. 1. The optical component may be sensitive to mechanical shock and/or vibration.

In some embodiments, die attach 220 is conductive. In some embodiments, die attach 220 is nonconductive.

In some embodiments, die attach 220 is elastomeric. For example, die attach 220 may have a Young's modulus which is less than about 50 MPa.

In some embodiments, die attach 220 comprises one or more of the following materials: epoxy, dry film, photoresist, or other suitable material.

FIG. 3 illustrates a simplified cross-sectional view of the MEMS package 200 shown in FIG. 2 mounted on a printed circuit board (PCB) 300, according to certain embodiments of the invention. As understood by those of skill in the art, the principles discussed with reference to FIG. 3 may be applied to other IC packages, with modifications known to those of skill in the art to accommodate the other IC packages.

As illustrated, MEMS package 200, comprising body 205 and leads 260, is mechanically and electrically attached to PCB 300 by solder connections 310, which are electrically and mechanically connected to both PCB 300 and the leads 260 of MEMS package 200.

In addition, grommets 320 each surround one of the leads 260 between PCB 300 and MEMS package 200 or the body 205 of MEMS package 200, where, as discussed above, body 205 comprises MEMS die 210, die attach 220, lead frame 230, bond wires 240, and packaging material 250. In some embodiments, grommets 320, or at least a portion of each of the grommets 320 are compressed between PCB 300 and the MEMS package 200 or the body 205 of MEMS package 200, such that grommets 320 exert a force on each of PCB 300 and the MEMS package 200 or the body 205 of MEMS package 200.

In some embodiments, grommets 320 each contact and exert a force on the lead 260 which they surround. In some embodiments, grommets 320 each contact and exert a force on opposite sides of the lead 260 which they surround. In some embodiments, grommets 320 each contact and exert a force on all of the sides or the portions of the sides of the lead 260 which the grommets 320 surround.

In some embodiments, grommets 320 are elastomeric. For example, grommets 328 may have a Young's modulus which is less than about 50 MPa.

In some embodiments, grommets 320 comprise one or more of the following materials: silicon rubber, epdm rubber, or other suitable material.

In some embodiments, grommets may have be about 2 mm high with a cross-sectional diameter of about 1 mm.

Accordingly, grommets 320 absorb mechanical vibration and shock energy which would otherwise be translated from the PCB 300, for example, through leads 260 to MEMS package 220 or to the body 205 of MEMS package 200. For example, in some embodiments, grommets 320 prevent or attenuate harmonic or resonant mechanical ringing. Accordingly, the mechanical forces generated on the various portions of the structure of the MEMS package 200 by the mechanical vibration and shock waves are greatly reduced. For example, mechanical vibration and shock energy which is conducted to leads 260 by the PCB 300 is partially or completely absorbed by grommets 320, such that the MEMS device packaged in package 200 is protected from being affected by the mechanical vibration and shock energy. Similarly, mechanical vibration and shock energy generated by the MEMS device packaged in package 200 or reflected from package 200 is additionally absorbed by grommets 320. Consequently, the MEMS device packaged in package 200 and surrounding devices are additionally protected.

Figure 3A:
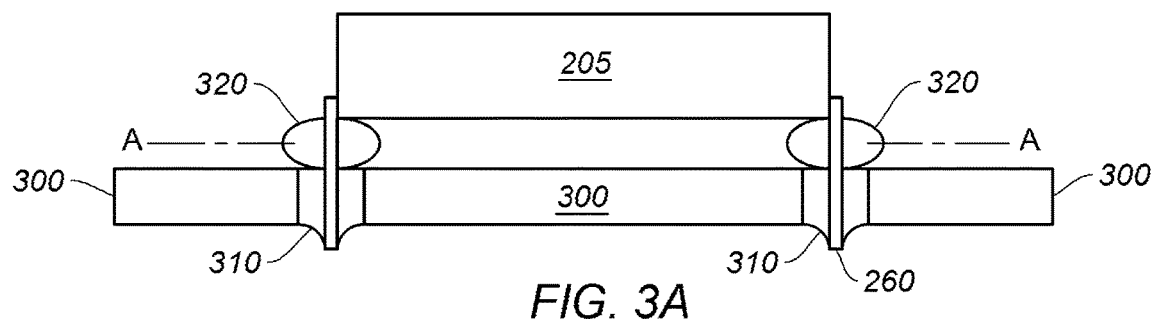
FIG. 3A illustrates a simplified cross-sectional view of the MEMS package shown in FIG. 2 mounted on a printed circuit board (PCB), according to certain embodiments of the invention.
Figure 3B:
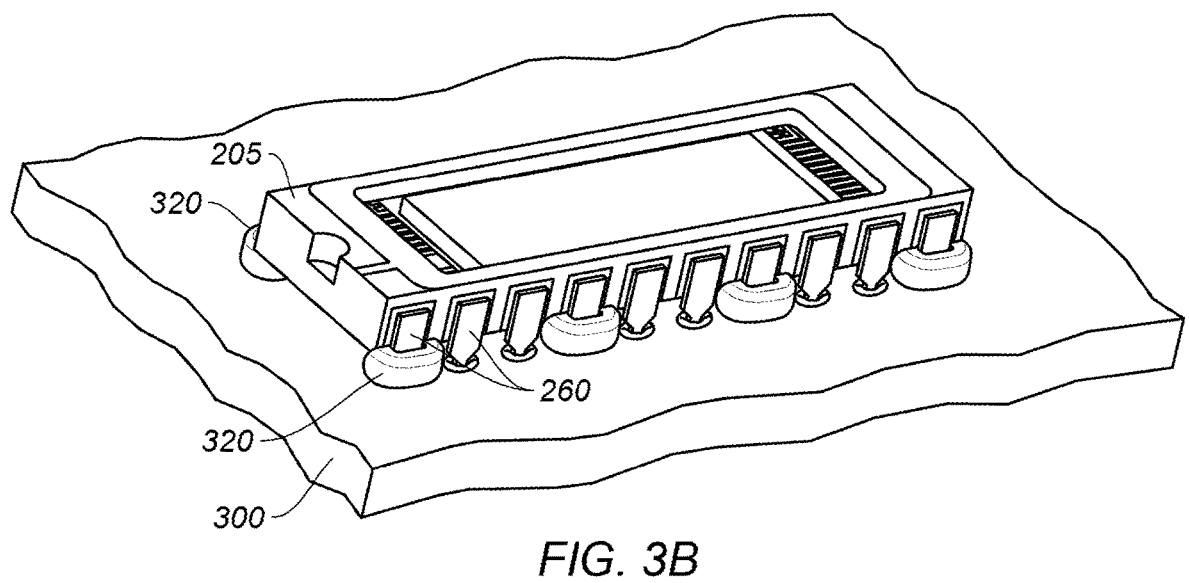
FIG. 3B illustrates a simplified perspective view of a MEMS package having grommets according to certain embodiments of the invention.

FIG. 3B illustrates a simplified perspective view of a MEMS package having grommets 320 according to certain embodiments of the invention. As shown, the grommets 320 illustrated in FIG. 3B surround only some of the leads of the illustrated MEMS package.

Figure 4:
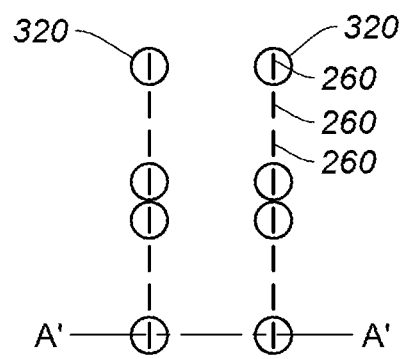
FIG. 4 illustrates a simplified cross-sectional view of the board mounted MEMS package illustrated in FIG. 3A.

FIG. 4 illustrates a simplified cross-sectional view of the board mounted MEMS package 200 illustrated in FIG. 3 in a plane defined by the line A-A and perpendicular to the view of FIG. 3, where FIG. 3 is a simplified cross-sectional view of the board mounted MEMS package 200 in a plane defined by the line A'-A' and perpendicular to the figure view of FIG. 4. As understood by those of skill in the art, the principles discussed with reference to FIG. 4 may be applied to other IC packages, with modifications known to those of skill in the art to accommodate the other IC packages.

In the illustrated embodiment, the outermost leads 260 and the innermost leads 260 are surrounded by grommets 320. In addition, certain groups of adjacent leads 260 are surrounded by grommets 320, and certain other groups of adjacent leads 260 are not surrounded by grommets 320. In alternative embodiments, all of the leads 260 are surrounded by grommets 320. In some embodiments, only the outermost leads 260 are surrounded by grommets 320.

In some embodiments, the arrangement of leads 260 having grommets 320 among leads 260 not having grommets 320 is irregular or asymmetric. For example, a 20-pin dual in-line package (DIP), may be mounted to a PCB where pin numbers 1, 3, 4, 7, 10, 12, 14, 15, 16, and 20 have grommets 320 surrounding them, and the other pin numbers do not have grommets surrounding them. As understood by those of skill in the art, other irregular or asymmetric arrangements may be used.

An advantage to an irregular or asymmetric arrangement of leads 260 having grommets 320 among leads 260 not having grommets 320 is that mechanical waves traveling through the structure are less likely to constructively interfere because the resonant pathways and spaces are disturbed or interrupted by the irregular or asymmetric arrangement of the grommets 320. Accordingly, the mechanical forces generated on the various portions of the structure by the mechanical waves are attenuated more than if the leads 260 having grommets 320 among leads 260 not having grommets 320 were regular or symmetric.

To manufacture or assemble the board mounted MEMS package 200 illustrated in FIG. 3, MEMS package 200 is positioned such that leads 260 extend into or through PCB 300. While so positioned, leads 260 are soldered to PCB 300 using techniques understood by those of skill in the art to mechanically and electrically connect leads 260, and therefore MEMS package 200 to PCB 300.

In some embodiments, grommets 320 are placed on the leads 260 prior to positioning MEMS package 200 such that the leads 260 extend into or through PCB 300. Accordingly, in such embodiments, positioning MEMS package 200 such that the leads 260 extend into or through PCB 300 causes grommets 320 to contact PCB 300. For example, MEMS package 200 may be positioned such that the grommets 320 surrounding leads 260 are compressed between PCB 300 and the body 205 of MEMS package 200. While in this position, leads 260 are soldered to PCB 300 using techniques understood by those of skill in the art.

In some embodiments, grommets 320 are placed on the PCB 300 prior to positioning MEMS package 200 such that the leads 260 extend into or through PCB 300. For example, grommets 320 may be placed on PCB 300 such that holes in the grommets 820 align with holes in PCB 300 into or through which leads 260 are to be inserted. Grommets 320 may, for example, be adhered to PCB 300 using an adhesive. In some embodiments, the adhesive is subsequently removed. Accordingly, in such embodiments, positioning MEMS package 200 such that the leads 260 extend into or through PCB 300 causes the leads 260 to be inserted into corresponding grommets 320 which are previously positioned on PCB 300, and causes grommets 320 to contact the body 205 of MEMS package 200. For example, MEMS package 200 may be positioned such that the grommets 320 surrounding leads 260 are compressed between PCB 300 and the body 205 of MEMS package 200. While in this position, leads 260 are soldered to PCB 300 using techniques understood by those of skill in the art.

Figure 5:
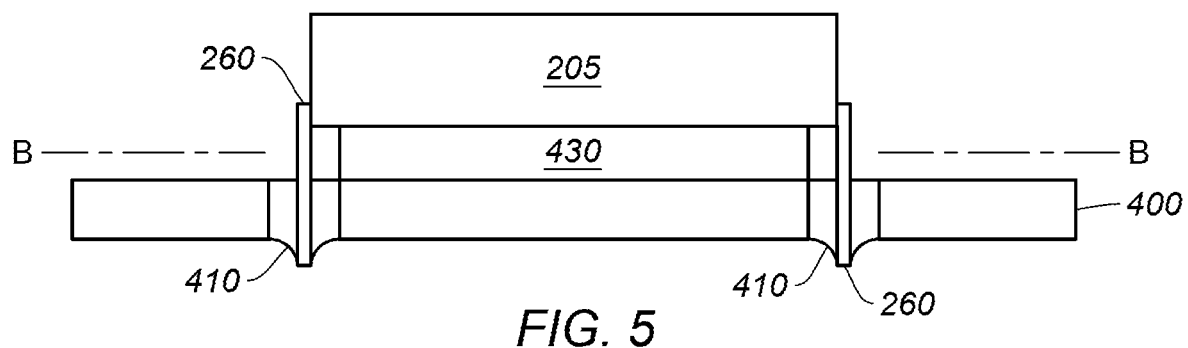
FIG. 5 illustrates a simplified cross-sectional view of the MEMS package shown in FIG. 2 mounted on a printed circuit board (PCB), according to certain embodiments of the invention.

FIG. 5 illustrates a simplified cross-sectional view of the MEMS package 200 shown in FIG. 2 mounted on a printed circuit board (PCB) 400, according to certain embodiments of the invention. As understood by those of skill in the art, the principles discussed with reference to FIG. 5 may be applied to other IC packages, with modifications known to those of skill in the art to accommodate the other IC packages.

As illustrated, MEMS package 200, comprising body 205 and leads 260, is mechanically and electrically attached to PCB 400 by solder connections 410, which are electrically and mechanically connected to both PCB 400 and the leads 260 of MEMS package 200.

In addition, pad 430 is between PCB 400 and MEMS package 200 or the body 205 of MEMS package 200. In some embodiments, pad 430, or at least a portion of pad 430, is compressed between PCB 400 and the MEMS package 200 or the body 205 of MEMS package 200, such that pad 430 exerts a force on each of PCB 400 and the MEMS package 200 or the body 205 of MEMS package 200.

In some embodiments, pad 430 extends so as to press against and exert a force on one or more of the leads 260. In some embodiments, pad 430 and the body 205 of MEMS package 200 are coextensive, such that lateral edges or sides of pad 430 and the body 205 of MEMS package 200 are aligned. In some embodiments, one or more lateral sides of pad 430 are spaced apart from the leads 260 nearest thereto, such that the body 205 of MEMS package 200 extends farther than the pad 430 in a direction from the middle of the body 205 of MEMS package 200 toward the leads 260 along the PCB 400.

In some embodiments, pad 430 comprises or is covered with an adhesive material, such that pad 430 adheres to either or both of PCB 400 and MEMS package 200. For example, in some embodiments, pad 430 comprises one or more of the following adhesive materials: die attach epoxy, hermetic epoxy, or other suitable material.

In some embodiments, at least one or more portions of pad 430 are not conductive, such that pad 530 provides electrical insulation between PCB 500 and MEMS package 200. For example, in some embodiments, pad 530 comprises one or more of the following non-conductive materials: non-conductive epoxy, or other suitable material.

In some embodiments, at least one or more portions of pad 430 are conductive, such that pad 430 provides one or more conductive paths between PCB 400 and MEMS package 200. For example, in some embodiments, pad 430 comprises one or more of the following conductive materials: silver paste, conductive epoxy, or other suitable material.

In some embodiments, pad 430 is elastomeric. For example, pad 430 may have a Young's modulus which is less than about 50 MPa.

In some embodiments, pad 430 may be about 7 mm×25 mm. Other sizes may be used.

Accordingly, pad 430 absorbs mechanical vibration and shock energy translated from the PCB 400 through, for example, leads 260 to MEMS package 220 or to the body 205 of MEMS package 200. For example, in some embodiments, pad 430 prevents or attenuates harmonic or resonant mechanical ringing. Accordingly, the mechanical forces generated on the various portions of the structure of the MEMS package 200 by the mechanical vibration and shock waves are greatly reduced.

Figure 6:
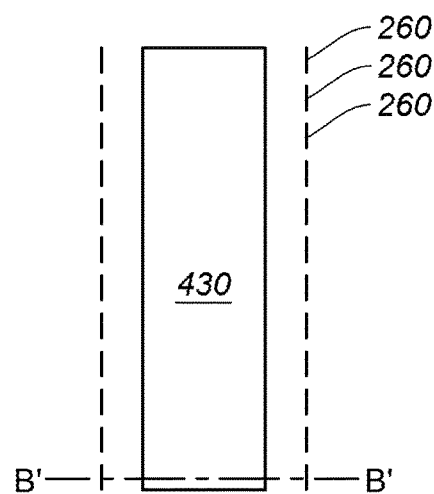
FIG. 6 illustrates a simplified cross-sectional view of the board mounted MEMS package illustrated in FIG. 5.

FIG. 6 illustrates a simplified cross-sectional view of the board mounted MEMS package 200 illustrated in FIG. 5 in a plane defined by the line B-B and perpendicular to the view of FIG. 5, where FIG. 5 is a simplified cross-sectional view of the board mounted MEMS package 200 in a plane defined by the line B'-B' and perpendicular to the figure view of FIG. 6. As understood by those of skill in the art, the principles discussed with reference to FIG. 6 may be applied to other IC packages, with modifications known to those of skill in the art to accommodate the other IC packages.

In the illustrated embodiment, the pad 430 is spaced apart from each of the leads 260 by a substantially identical distance because the lateral surfaces of pad 430 facing leads 260 are substantially planar and are parallel with planes defined by the leads 260. In some embodiments, the lateral surfaces of pad 430 are not planar, but instead are irregular.

An advantage to an irregular lateral surface of pad 430 is that mechanical waves traveling through the structure are less likely to constructively interfere because the resonant pathways and spaces are disturbed or interrupted by the irregular arrangement. Accordingly, the mechanical forces generated on the various portions of the structure by the mechanical waves are attenuated more than if the lateral surfaces of pad 430 facing leads 260 were planar.

To manufacture or assemble the board mounted MEMS package 200 illustrated in FIG. 5, MEMS package 200 is positioned such that leads 260 extend into or through PCB 400. While so positioned, leads 260 are soldered to PCB 400 using techniques understood by those of skill in the art to mechanically and electrically connect leads 260, and therefore MEMS package 200 to PCB 400.

In some embodiments, pad 430 is placed on the body 205 of MEMS package 200 prior to positioning MEMS package 200 such that the leads 260 extend into or through PCB 400. Pad 430 may, for example, be adhered to body 205 using an adhesive. In some embodiments, the adhesive is subsequently removed. Accordingly, in such embodiments, positioning MEMS package 200 such that the leads 260 extend into or through PCB 400 causes pad 430 to contact PCB 400. For example, MEMS package 200 may be positioned such that the pad 430 is compressed between PCB 400 and the body 205 of MEMS package 200. While in this position, leads 260 are soldered to PCB 400 using techniques understood by those of skill in the art.

In some embodiments, pad 430 is placed on the PCB 400 prior to positioning MEMS package 200 such that the leads 260 extend into or through PCB 400. For example, pad 430 may be adhered to PCB 400 using an adhesive. In some embodiments, the adhesive is subsequently removed. Accordingly, in such embodiments, positioning MEMS package 200 such that the leads 260 extend into or through PCB 400 causes pad 430 to contact the body 205 of MEMS package 200. For example, MEMS package 200 may be positioned such that the pad 430 is compressed between PCB 400 and the body 205 of MEMS package 200. While in this position, leads 260 are soldered to PCB 400 using techniques understood by those of skill in the art.

Figure 7:
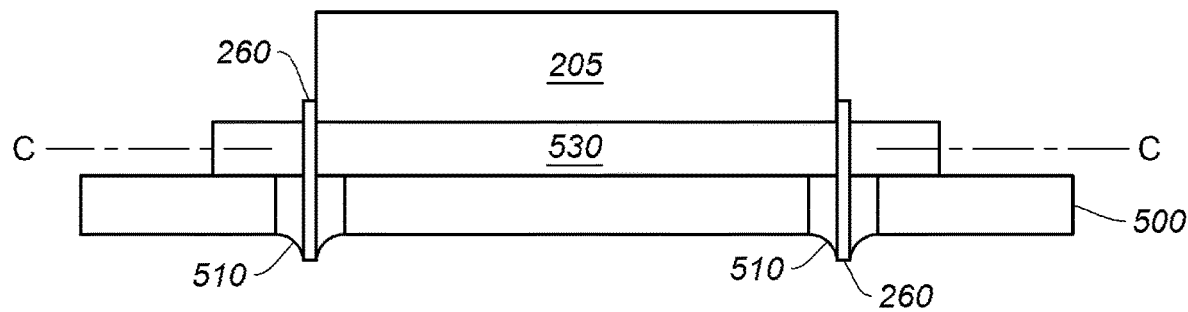
FIG. 7 illustrates a simplified cross-sectional view of the MEMS package shown in FIG. 2 mounted on a printed circuit board (PCB), according to certain embodiments of the invention.

FIG. 7 illustrates a simplified cross-sectional view of the MEMS package 200 shown in FIG. 2 mounted on a printed circuit board (PCB) 500, according to certain embodiments of the invention. As understood by those of skill in the art, the principles discussed with reference to FIG. 7 may be applied to other IC packages, with modifications known to those of skill in the art to accommodate the other IC packages.

As illustrated, MEMS package 200, comprising body 205 and leads 260, is mechanically and electrically attached to PCB 500 by solder connections 510, which are electrically and mechanically connected to both PCB 500 and the leads 260 of MEMS package 200.

In addition, pad 530 is between PCB 500 and MEMS package 200 or the body 205 of MEMS package 200. In some embodiments, pad 530, or at least a portion of pad 530 is compressed between PCB 500 and the MEMS package 200 or the body 205 of MEMS package 200, such that pad 530 exerts a force on each of PCB 500 and the MEMS package 200 or the body 205 of MEMS package 200.

In addition, one or more leads 260 extends through pad 530, such that pad 530 surrounds each of the leads 260 extending therethrough. In some embodiments, pad 530 contacts and exerts a force on each of the leads 260 which it surrounds. In some embodiments, pad 530 contacts and exerts a force on opposite sides of the leads 260 which it surrounds. In some embodiments, pad 530 contacts and exerts a force on all of the sides or the portions of the sides of the leads 260 which the pad 530 surrounds.

In some embodiments, pad 530 comprises or is covered with an adhesive material, such that pad 530 adheres to either or both of PCB 500 and MEMS package 200. For example, in some embodiments, pad 530 comprises one or more of the following adhesive materials: package attachment epoxy, or other suitable material.

In some embodiments, at least one or more portions of pad 530 are not conductive, such that pad 530 provides electrical insulation between PCB 500 and MEMS package 200. For example, in some embodiments, pad 530 comprises one or more of the following non-conductive materials: non-conductive epoxy, or other suitable material In some embodiments, at least one or more portions of pad 530 are conductive, such that pad 530 provides one or more conductive paths between PCB 500 and MEMS package 200. For example, in some embodiments, pad 530 comprises one or more of the following conductive materials: conductive epoxy, or other suitable material.

In some embodiments, pad 530 is elastomeric. For example, pad 530 may have a Young's modulus which is less than about 50 MPa.

Accordingly, pad 530 absorbs mechanical vibration and shock energy translated from the PCB 500 through leads 260 to MEMS package 220 or to the body 205 of MEMS package 200. Therefore, pad 530 prevents or attenuates harmonic or resonant mechanical ringing, such that the mechanical forces generated on the various portions of the structure of the MEMS package 200 by the mechanical vibration and shock waves are greatly reduced.

Figure 8:
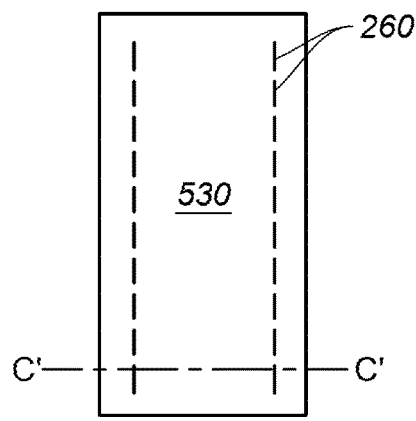
FIG. 8 illustrates a simplified cross-sectional view of the board mounted MEMS package illustrated in FIG. 7.

FIG. 8 illustrates a simplified cross-sectional view of the board mounted MEMS package 200 illustrated in FIG. 7 in a plane defined by the line C-C and perpendicular to the view of FIG. 7, where FIG. 7 is a simplified cross-sectional view of the board mounted MEMS package 200 in a plane defined by the line C'-C' and perpendicular to the figure view of FIG. 8. As understood by those of skill in the art, the principles discussed with reference to FIG. 8 may be applied to other IC packages, with modifications known to those of skill in the art to accommodate the other IC packages.

In the illustrated embodiment, the pad 530 contacts and exerts a force on each of the leads 260.

In some embodiments, the pad 530 does not contact one or more of the leads 260. In some embodiments, the arrangement of leads 260 contacted by the pad 530 among leads 260 not contacted by the pad 530 is irregular or asymmetric. For example, a 20-pin dual in-line package (DIP), may be mounted to a PCB where pin numbers 1, 3, 4, 7, 10, 12, 14, 15, 16, and 20 are contacted by the pad 530, and the other pin numbers are not contacted by the pad 530. As understood by those of skill in the art, other irregular or asymmetric arrangements may be used.

An advantage to an irregular or asymmetric arrangement of leads 260 contacted by the pad 530 among leads 260 not contacted by the pad 530 is that mechanical waves traveling through the structure are less likely to constructively interfere because the resonant pathways and spaces are disturbed or interrupted by the irregular or asymmetric arrangement of the leads 260 contacted by the pad 530. Accordingly, the mechanical forces generated on the various portions of the structure by the mechanical waves are attenuated more than if the leads 260 contacted by the pad 530 among leads 260 not contacted by the pad 530 were regular or symmetric.

To manufacture or assemble the board mounted MEMS package 200 illustrated in FIG. 7, MEMS package 200 is positioned such that leads 260 extend into or through PCB 500. While so positioned, leads 260 are soldered to PCB 500 using techniques understood by those of skill in the art to mechanically and electrically connect leads 260, and therefore MEMS package 200 to PCB 500.

In some embodiments, pad 530 is placed on the body 205 of MEMS package 200 prior to positioning MEMS package 200 such that the leads 260 extend into or through PCB 500. Pad 530 may, for example, be adhered to body 205 using an adhesive. In some embodiments, the adhesive is subsequently removed. In some embodiments, no adhesive is used. Accordingly, in such embodiments, positioning MEMS package 200 such that the leads 260 extend into or through PCB 500 causes pad 530 to contact PCB 500. For example, MEMS package 200 may be positioned such that the pad 530 is compressed between PCB 500 and the body 205 of MEMS package 200. While in this position, leads 260 are soldered to PCB 500 using techniques understood by those of skill in the art. In some embodiments, placing pad 530 on body 205 causes one or more leads 260 to pierce pad 530. In some embodiments, pad 530 includes holes through which leads 260 extend prior to pad 530 being placed on body 205. In some embodiments, leads 260 extending through pre-existing holes in pad 530 do not contact pad 530 after soldering. In some embodiments, leads 260 extending through pre-existing holes in pad 530 do contact pad 530 after soldering.

In some embodiments, pad 530 is placed on the pins 260 of MEMS package 200 prior to positioning MEMS package 200 such that the leads 260 extend into or through PCB 500. Pad 530 may, for example, be adhered to pins 260 using an adhesive. In some embodiments, the adhesive is subsequently removed. In some embodiments, no adhesive is used. In some embodiments, placing pad 530 on the pins 260 causes a friction fit connection between pad 530 and the pins 260. In some embodiments, placing pad 530 on the pins causes one or more pins 260 to pierce or partially pierce pad 530. Accordingly, in such embodiments, positioning MEMS package 200 such that the leads 260 extend into or through PCB 500 causes pad 530 to contact PCB 500 and body 205 of MEMS package 200. For example, MEMS package 200 may be positioned such that the pad 530 is compressed between PCB 500 and the body 205 of MEMS package 200. While in this position, leads 260 are soldered to PCB 500 using techniques understood by those of skill in the art. In some embodiments, pad 530 includes holes through or into which leads 260 extend prior to pad 530 being placed on body 205. In some embodiments, leads 260 extending through pre-existing holes in pad 530 do not contact pad 530 after soldering. In some embodiments, leads 260 extending through pre-existing holes in pad 530 do contact pad 530 after soldering.

In some embodiments, pad 530 is placed on the PCB 500 prior to positioning MEMS package 200 such that the leads 260 extend into or through PCB 500. For example, pad 530 may be adhered to PCB 500 using an adhesive. In some embodiments, the adhesive is subsequently removed. In some embodiments, positioning MEMS package 200 such that the leads 260 extend into or through PCB 500 causes a friction fit connection between pad 530 and the pins 260. In some embodiments, positioning MEMS package 200 such that the leads 260 extend into or through PCB 500 causes one or more pins 260 to pierce or partially pierce or further pierce pad 530. Accordingly, in such embodiments, positioning MEMS package 200 such that the leads 260 extend into or through PCB 500 causes pad 530 to contact PCB 500 and body 205 of MEMS package 200. For example, MEMS package 200 may be positioned such that the pad 530 is compressed between PCB 500 and the body 205 of MEMS package 200. While in this position, leads 260 are soldered to PCB 500 using techniques understood by those of skill in the art. In some embodiments, pad 530 includes holes through or into which leads 260 extend prior to pad 530 being placed on body 205. In some embodiments, leads 260 extending through pre-existing holes in pad 530 do not contact pad 530 after soldering. In some embodiments, leads 260 extending through pre-existing holes in pad 530 do contact pad 530 after soldering.

Figure 9:
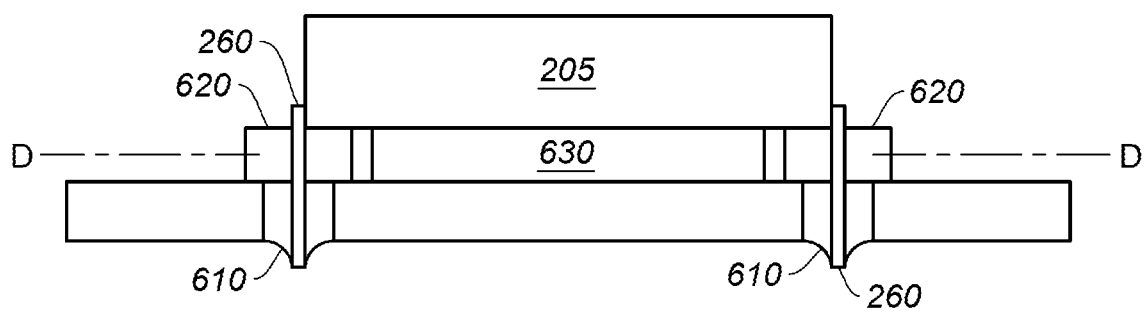
FIG. 9 illustrates a simplified cross-sectional view of the MEMS package shown in FIG. 2 mounted on a printed circuit board (PCB), according to certain embodiments of the invention.

FIG. 9 illustrates a simplified cross-sectional view of the MEMS package 200 shown in FIG. 2 mounted on a printed circuit board (PCB) 600, according to certain embodiments of the invention. As understood by those of skill in the art, the principles discussed with reference to FIG. 9 may be applied to other IC packages, with modifications known to those of skill in the art to accommodate the other IC packages.

As illustrated, MEMS package 200, comprising body 205 and leads 260, is mechanically and electrically attached to PCB 600 by solder connections 610, which are electrically and mechanically connected to both PCB 600 and the leads 260 of MEMS package 200.

In addition, grommets 620 each surround one or more of the leads 260 between PCB 600 and MEMS package 200 or the body 205 of MEMS package 200. In some embodiments, grommets 620, or at least a portion of each of the grommets 620 are compressed between PCB 600 and the MEMS package 200 or the body 205 of MEMS package 200, such that grommets 620 exert a force on each of PCB 600 and the MEMS package 200 or the body 205 of MEMS package 200.

In some embodiments, grommets 620 each contact and exert a force on the lead(s) 260 which they surround. In some embodiments, grommets 620 each contact and exert a force on opposite sides of the lead(s) 260 which they surround. In some embodiments, grommets 620 each contact and exert a force on all of the sides or the portions of the sides of the lead(s) 260 which the grommets 620 surround.

In some embodiments, grommets 620 are elastomeric. For example, grommets 628 may have a Young's modulus which is less than about 50 MPa.

In some embodiments, grommets 620 comprise one or more of the following materials: silicon rubber, EPDM rubber, or other suitable material.

Accordingly, grommets 620 absorb mechanical vibration and shock energy which would otherwise be translated from the PCB 600 through, for example, leads 260 to MEMS package 220 or to the body 205 of MEMS package 200. For example, in some embodiments, grommets 620 prevent or attenuate harmonic or resonant mechanical ringing. Accordingly, the mechanical forces generated on the various portions of the structure of the MEMS package 200 by the mechanical vibration and shock waves are greatly reduced.

In addition, pad 630 is between PCB 600 and MEMS package 200 or the body 205 of MEMS package 200. In some embodiments, pad 630, or at least a portion of pad 630, is compressed between PCB 600 and the MEMS package 200 or the body 205 of MEMS package 200, such that pad 630 exerts a force on each of PCB 600 and the MEMS package 200 or the body 205 of MEMS package 200.

In some embodiments, pad 630 extends so as to press against and exert a force on one or more of the leads 260. In some embodiments, pad 630 and the body 205 of MEMS package 200 are coextensive, such that lateral edges or sides of pad 630 and the body 205 of MEMS package 200 are aligned. In some embodiments, one or more lateral sides of pad 630 are spaced apart from the leads 260 nearest thereto, such that the body 205 of MEMS package 200 extends farther than the pad 630 in a direction from the middle of the body 205 of MEMS package 200 toward the leads 260 along the PCB 600.

In some embodiments, pad 630 comprises or is covered with an adhesive material, such that pad 630 adheres to either or both of PCB 600 and MEMS package 200. For example, in some embodiments, pad 630 comprises one or more of the following adhesive materials: die attach epoxy, or other suitable material.

In some embodiments, at least one or more portions of pad 630 are not conductive, such that pad 530 provides electrical insulation between PCB 500 and MEMS package 200. For example, in some embodiments, pad 530 comprises one or more of the following non-conductive materials: non-conductive epoxy, or other suitable material.

In some embodiments, at least one or more portions of pad 630 are conductive, such that pad 630 provides one or more conductive paths between PCB 600 and MEMS package 200. For example, in some embodiments, pad 630 comprises one or more of the following conductive materials: conductive epoxy, or other suitable material.

In some embodiments, pad 630 is elastomeric. For example, pad 630 may have a Young's modulus which is less than about 50 MPa.

Accordingly, pad 630 absorbs mechanical vibration and shock energy translated from the PCB 600 through, for example, leads 260 to MEMS package 220 or to the body 205 of MEMS package 200. For example, in some embodiments, pad 630 prevents or attenuates harmonic or resonant mechanical ringing. Accordingly, the mechanical forces generated on the various portions of the structure of the MEMS package 200 by the mechanical vibration and shock waves are greatly reduced.

Figure 10:
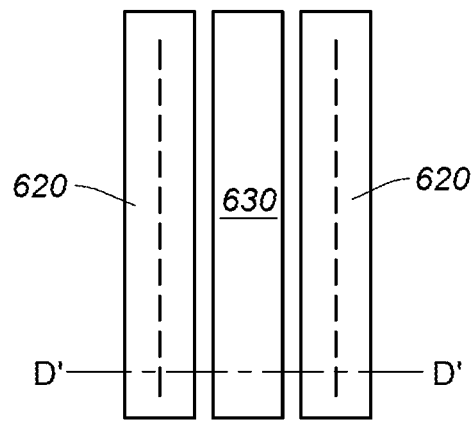
FIG. 10 illustrates a simplified cross-sectional view of the board mounted MEMS package illustrated in FIG. 9.
Figure 11:
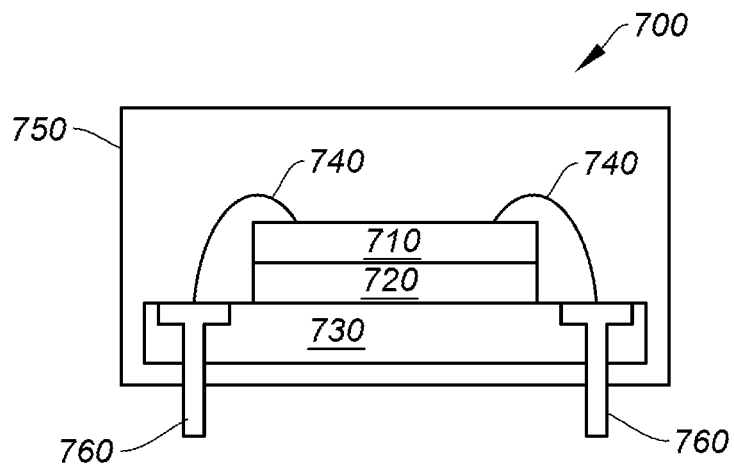
FIG. 11 is a simplified cross-sectional view of a MEMS integrated circuit (IC) package, according to certain embodiments of the invention.

FIG. 10 illustrates a simplified cross-sectional view of the board mounted MEMS package 200 illustrated in FIG. 9 in a plane defined by the line D-D and perpendicular to the view of FIG. 9, where FIG. 9 is a simplified cross-sectional view of the board mounted MEMS package 200 in a plane defined by the line D'-D' and perpendicular to the figure view of FIG. 10. As understood by those of skill in the art, the principles discussed with reference to FIG. 10 may be applied to other IC packages, with modifications known to those of skill in the art to accommodate the other IC packages.

In the illustrated embodiment, all leads 260 are contacted by grommets 620. In alternative embodiments, not all of the leads 260 contact grommets 620. In addition, the grommets 620 are compound grommets where each grommet contacts multiple and/or surrounds leads 260, in contrast to grommets 320, which each contacts a single lead 260.

In some embodiments, the arrangement of leads 260 having grommets 620 among leads 260 not having grommets 620 is irregular or asymmetric. For example, a 20-pin dual in-line package (DIP), may be mounted to a PCB where pin numbers 1, 3, 4, 7, 10, 12, 14, 15, 16, and 20 have grommets 620 surrounding them, and the other pin numbers do not have grommets surrounding them. As understood by those of skill in the art, other irregular or asymmetric arrangements may be used.

An advantage to an irregular or asymmetric arrangement of leads 260 having grommets 620 among leads 260 not having grommets 620 is that mechanical waves traveling through the structure are less likely to constructively interfere because the resonant pathways and spaces are disturbed or interrupted by the irregular or asymmetric arrangement of the grommets 620. Accordingly, the mechanical forces generated on the various portions of the structure by the mechanical waves are attenuated more than if the leads 260 having grommets 620 among leads 260 not having grommets 620 were regular or symmetric.

In the illustrated embodiment, the pad 630 is spaced apart from each of the leads 260 by a substantially identical distance because the lateral surfaces of pad 630 facing leads 260 are substantially planar and are parallel with planes defined by the leads 260. In some embodiments, the lateral surfaces of pad 630 are not planar, but instead are irregular.

An advantage to an irregular lateral surface of pad 630 is that mechanical waves traveling through the structure are less likely to constructively interfere because the resonant pathways and spaces are disturbed or interrupted by the irregular arrangement. Accordingly, the mechanical forces generated on the various portions of the structure by the mechanical waves are attenuated more than if the lateral surfaces of pad 630 facing leads 260 were planar.

To manufacture or assemble the board mounted MEMS package 200 illustrated in FIG. 9, MEMS package 200 is positioned such that leads 260 extend into or through PCB 600. While so positioned, leads 260 are soldered to PCB 600 using techniques understood by those of skill in the art to mechanically and electrically connect leads 260, and therefore MEMS package 200 to PCB 600.

In some embodiments, grommets 620 are placed on the leads 260 prior to positioning MEMS package 200 such that the leads 260 extend into or through PCB 600. Accordingly, in such embodiments, positioning MEMS package 200 such that the leads 260 extend into or through PCB 600 causes grommets 620 to contact PCB 600. For example, MEMS package 200 may be positioned such that the grommets 620 surrounding leads 260 are compressed between PCB 600 and the body 205 of MEMS package 200. While in this position, leads 260 are soldered to PCB 600 using techniques understood by those of skill in the art.

In some embodiments, grommets 620 are placed on the PCB 600 prior to positioning MEMS package 200 such that the leads 260 extend into or through PCB 600. For example, grommets 620 may be placed on PCB 600 such that holes in the grommets 820 align with holes in PCB 600 into or through which leads 260 are to be inserted. Grommets 620 may, for example, be adhered to PCB 600 using an adhesive. In some embodiments, the adhesive is subsequently removed. Accordingly, in such embodiments, positioning MEMS package 200 such that the leads 260 extend into or through PCB 600 causes the leads 260 to be inserted into corresponding grommets 620 which are previously positioned on PCB 600, and causes grommets 620 to contact the body 205 of MEMS package 200. For example, MEMS package 200 may be positioned such that the grommets 620 surrounding leads 260 are compressed between PCB 600 and the body 205 of MEMS package 200. While in this position, leads 260 are soldered to PCB 600 using techniques understood by those of skill in the art.

In some embodiments, grommets 620 are placed on the pins 260 of MEMS package 200 prior to positioning MEMS package 200 such that the leads 260 extend into or through PCB 600. Grommets 620 may, for example, be adhered to pins 260 using an adhesive. In some embodiments, the adhesive is subsequently removed. In some embodiments, no adhesive is used. In some embodiments, placing grommets 620 on the pins 260 causes a friction fit connection between grommets 620 and the pins 260. In some embodiments, placing grommets 620 on the pins causes one or more pins 260 to pierce or partially pierce grommets 620. Accordingly, in such embodiments, positioning MEMS package 200 such that the leads 260 extend into or through PCB 600 causes grommets 620 to contact PCB 600 and body 205 of MEMS package 200. For example, MEMS package 200 may be positioned such that the grommets 620 are compressed between PCB 600 and the body 205 of MEMS package 200. While in this position, leads 260 are soldered to PCB 600 using techniques understood by those of skill in the art. In some embodiments, grommets 620 includes holes through or into which leads 260 extend prior to pad 630 being placed on body 205. In some embodiments, leads 260 extending through pre-existing holes in grommets 620 do not contact pad 630 after soldering. In some embodiments, leads 260 extending through pre-existing holes in grommets 620 do contact grommets 620 after soldering.

In some embodiments, pad 630 is placed on the body 205 of MEMS package 200 prior to positioning MEMS package 200 such that the leads 260 extend into or through PCB 600. Pad 630 may, for example, be adhered to body 205 using an adhesive. In some embodiments, the adhesive is subsequently removed. Accordingly, in such embodiments, positioning MEMS package 200 such that the leads 260 extend into or through PCB 600 causes pad 630 to contact PCB 600. For example, MEMS package 200 may be positioned such that the pad 630 is compressed between PCB 600 and the body 205 of MEMS package 200. While in this position, leads 260 are soldered to PCB 600 using techniques understood by those of skill in the art.

In some embodiments, pad 630 is placed on the PCB 600 prior to positioning MEMS package 200 such that the leads 260 extend into or through PCB 600. For example, pad 630 may be adhered to PCB 600 using an adhesive. In some embodiments, the adhesive is subsequently removed. Accordingly, in such embodiments, positioning MEMS package 200 such that the leads 260 extend into or through PCB 600 causes pad 630 to contact the body 205 of MEMS package 200. For example, MEMS package 200 may be positioned such that the pad 630 is compressed between PCB 600 and the body 205 of MEMS package 200. While in this position, leads 260 are soldered to PCB 600 using techniques understood by those of skill in the art.

FIG. 11 is a simplified cross-sectional view of a MEMS integrated circuit (IC) package 700, according to certain embodiments of the invention. The MEMS IC may, for example, include a mirror for the LiDAR-based system 100 (see FIG. 1). For example, because of its robustness against shock and vibration, and because of the sensitivity of the optical component to shock and vibration, MEMS package 700 can be particularly effectively used to form a portion of a LiDAR source, such as source 110 illustrated in FIG. 1.

MEMS package 700 includes MEMS die 710 attached to lead frame 730 with die attach 720. Lead frame 730 includes leads 760 which are electrically connected with MEMS die 710 with bond wires 740. In addition, lead frame 730, die attach 720, MEMS die 710, and bond wires 740 are encased in packaging material 750. MEMS package 700 may be considered to have a body 705 comprising MEMS die 710, die attach 720, lead frame 730, bond wires 740, and packaging material 750.

In some embodiments, die 710 includes an optical component, for example, to be used as a portion of a LiDAR source, such as source 110 illustrated in FIG. 1. The optical component may be sensitive to mechanical shock and/or vibration.

In some embodiments, die attach 720 is conductive. In some embodiments, die attach 720 is nonconductive.

In some embodiments, die attach 720 is elastomeric. For example, die attach 720 may have a Young's modulus which is less than about 50 MPa.

In some embodiments, die attach 720 comprises one or more of the following materials: die attach epoxy, or other suitable material.

Figure 12:
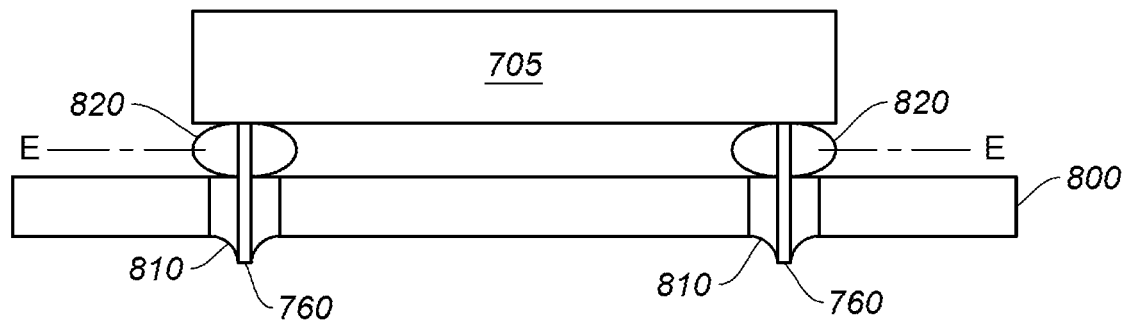
FIG. 12 illustrates a simplified cross-sectional view of the MEMS package shown in FIG. 11 mounted on a printed circuit board (PCB), according to certain embodiments of the invention.

FIG. 12 illustrates a simplified cross-sectional view of the MEMS package 700 shown in FIG. 11 mounted on a printed circuit board (PCB) 800, according to certain embodiments of the invention. As understood by those of skill in the art, the principles discussed with reference to FIG. 12 may be applied to other IC packages, with modifications known to those of skill in the art to accommodate the other IC packages.

As illustrated, MEMS package 700, comprising body 705 and leads 760, is mechanically and electrically attached to PCB 800 by solder connections 810, which are electrically and mechanically connected to both PCB 800 and the leads 760 of MEMS package 700.

In addition, grommets 820 each surround one of the leads 760 between PCB 800 and MEMS package 700 or the body 705 of MEMS package 700, where, as discussed above, body 705 comprises MEMS die 710, die attach 720, lead frame 730, bond wires 740, and packaging material 750. In some embodiments, grommets 820, or at least a portion of each of the grommets 820 are compressed between PCB 800 and the MEMS package 700 or the body 705 of MEMS package 700, such that grommets 820 exert a force on each of PCB 800 and the MEMS package 700 or the body 705 of MEMS package 700.

In some embodiments, grommets 820 each contact and exert a force on the lead 760 which they surround. In some embodiments, grommets 820 each contact and exert a force on opposite sides of the lead 760 which they surround. In some embodiments, grommets 820 each contact and exert a force on all of the sides or the portions of the sides of the lead 760 which the grommets 820 surround.

In some embodiments, grommets 820 are elastomeric. For example, grommets 828 may have a Young's modulus which is less than about 50 MPa.

In some embodiments, grommets 820 comprise one or more of the following materials: silicon rubber, EPDM rubber, or other suitable material.

In some embodiments, grommets may have be about 2 mm high with a cross-sectional diameter of about 1 mm.

Accordingly, grommets 820 absorb mechanical vibration and shock energy which would otherwise be translated from the PCB 800, for example, through leads 760 to MEMS package 720 or to the body 705 of MEMS package 700. For example, in some embodiments, grommets 820 prevent or attenuate harmonic or resonant mechanical ringing. Accordingly, the mechanical forces generated on the various portions of the structure of the MEMS package 700 by the mechanical vibration and shock waves are greatly reduced. For example, mechanical vibration and shock energy which is conducted to leads 760 by the PCB 800 is partially or completely absorbed by grommets 820, such that the MEMS device packaged in package 700 is protected from being affected by the mechanical vibration and shock energy. Similarly, mechanical vibration and shock energy generated by the MEMS device packaged in package 700 or reflected from package 700 is additionally absorbed by grommets 820. Consequently, consequently, the MEMS device packaged in package 200 and surrounding devices are additionally protected.

Figure 13:
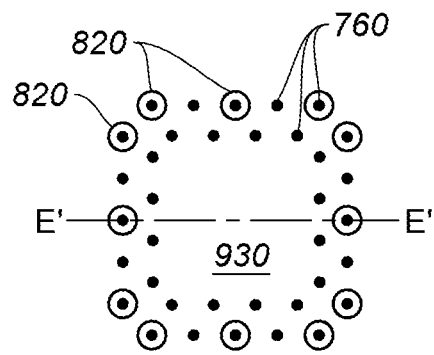
FIG. 13 illustrates a simplified cross-sectional view of the board mounted MEMS package illustrated in FIG. 12.

FIG. 13 illustrates a simplified cross-sectional view of the board mounted MEMS package 700 illustrated in FIG. 12 in a plane defined by the line E-E and perpendicular to the view of FIG. 12, where FIG. 12 is a simplified cross-sectional view of the board mounted MEMS package 700 in a plane defined by the line E'-E' and perpendicular to the figure view of FIG. 13. As understood by those of skill in the art, the principles discussed with reference to FIG. 13 may be applied to other IC packages, with modifications known to those of skill in the art to accommodate the other IC packages.

In the illustrated embodiment, certain leads 760 are surrounded by grommets 820. In addition, certain groups of adjacent leads 760 are surrounded by grommets 820, and certain other groups of adjacent leads 760 are not surrounded by grommets 820. In alternative embodiments, all of the leads 760 are surrounded by grommets 820. In some embodiments, only outermost leads 760 are surrounded by grommets 820.

In some embodiments, the arrangement of leads 760 having grommets 820 among leads 760 not having grommets 820 is irregular or asymmetric. For example, a pin grid array (PGA) package may be mounted to a PCB where the arrangement of leads 760 having grommets 820 among leads 760 not having grommets 820 is irregular or asymmetric. As understood by those of skill in the art, many irregular or asymmetric arrangements may be used.

An advantage to an irregular or asymmetric arrangement of leads 760 having grommets 820 among leads 760 not having grommets 820 is that mechanical waves traveling through the structure are less likely to constructively interfere because the resonant pathways and spaces are disturbed or interrupted by the irregular or asymmetric arrangement of the grommets 820. Accordingly, the mechanical forces generated on the various portions of the structure by the mechanical waves are attenuated more than if the leads 760 having grommets 820 among leads 760 not having grommets 820 were regular or symmetric.

To manufacture or assemble the board mounted MEMS package 700 illustrated in FIG. 12, MEMS package 700 is positioned such that leads 760 extend into or through PCB 800. While so positioned, leads 760 are soldered to PCB 800 using techniques understood by those of skill in the art to mechanically and electrically connect leads 760, and therefore MEMS package 700 to PCB 800.

In some embodiments, grommets 820 are placed on the leads 760 prior to positioning MEMS package 700 such that the leads 760 extend into or through PCB 800. Accordingly, in such embodiments, positioning MEMS package 700 such that the leads 760 extend into or through PCB 800 causes grommets 820 to contact PCB 800. For example, MEMS package 700 may be positioned such that the grommets 820 surrounding leads 760 are compressed between PCB 800 and the body 705 of MEMS package 700. While in this position, leads 760 are soldered to PCB 800 using techniques understood by those of skill in the art.

In some embodiments, grommets 820 are placed on the PCB 800 prior to positioning MEMS package 700 such that the leads 760 extend into or through PCB 800. For example, grommets 820 may be placed on PCB 800 such that holes in the grommets 820 align with holes in PCB 800 into or through which leads 760 are to be inserted. Grommets 820 may, for example, be adhered to PCB 800 using an adhesive. In some embodiments, the adhesive is subsequently removed. Accordingly, in such embodiments, positioning MEMS package 700 such that the leads 760 extend into or through PCB 800 causes the leads 760 to be inserted into corresponding grommets 820 which are previously positioned on PCB 800, and causes grommets 820 to contact the body 705 of MEMS package 700. For example, MEMS package 700 may be positioned such that the grommets 820 surrounding leads 760 are compressed between PCB 800 and the body 705 of MEMS package 700. While in this position, leads 760 are soldered to PCB 800 using techniques understood by those of skill in the art.

Figure 14:
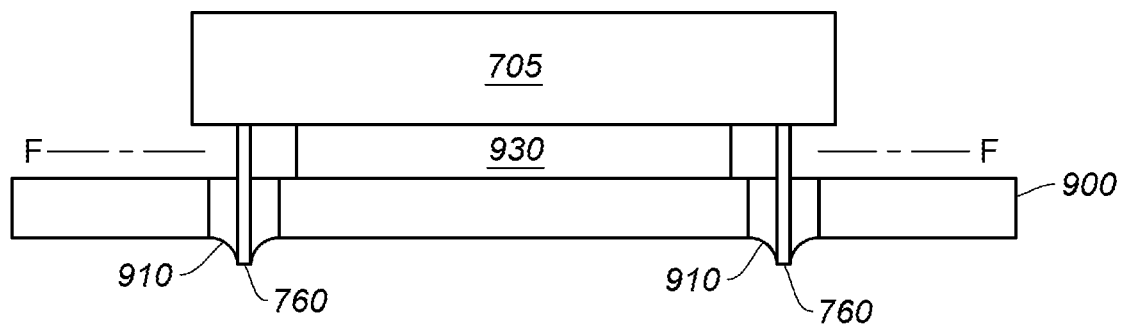
FIG. 14 illustrates a simplified cross-sectional view of the MEMS package shown in FIG. 11 mounted on a printed circuit board (PCB), according to certain embodiments of the invention.

FIG. 14 illustrates a simplified cross-sectional view of the MEMS package 700 shown in FIG. 11 mounted on a printed circuit board (PCB) 900, according to certain embodiments of the invention. As understood by those of skill in the art, the principles discussed with reference to FIG. 14 may be applied to other IC packages, with modifications known to those of skill in the art to accommodate the other IC packages.

As illustrated, MEMS package 700, comprising body 705 and leads 760, is mechanically and electrically attached to PCB 900 by solder connections 910, which are electrically and mechanically connected to both PCB 900 and the leads 760 of MEMS package 700.

In addition, pad 930 is between PCB 900 and MEMS package 700 or the body 705 of MEMS package 700. In some embodiments, pad 930, or at least a portion of pad 930 is compressed between PCB 900 and the MEMS package 700 or the body 705 of MEMS package 700, such that pad 930 exerts a force on each of PCB 900 and the MEMS package 700 or the body 705 of MEMS package 700.

In some embodiments, pad 930 extends so as to press against and exert a force on one or more of the leads 760. In some embodiments, one or more lateral sides of pad 930 are spaced apart from the leads 760 nearest thereto, such that the body 705 of MEMS package 700 extends farther than the pad 930 in a direction from the middle of the body 705 of MEMS package 700 toward the leads 760 along the PCB 900.

In some embodiments, pad 930 comprises or is covered with an adhesive material, such that pad 930 adheres to either or both of PCB 900 and MEMS package 700. For example, in some embodiments, pad 930 comprises one or more of the following adhesive materials: die attach epoxy, or other suitable material.

In some embodiments, at least one or more portions of pad 930 are not conductive, such that pad 1030 provides electrical insulation between PCB 1000 and MEMS package 700. For example, in some embodiments, pad 1030 comprises one or more of the following non-conductive materials: non-conductive epoxy, or other suitable material.

In some embodiments, at least one or more portions of pad 930 are conductive, such that pad 930 provides one or more conductive paths between PCB 900 and MEMS package 700. For example, in some embodiments, pad 930 comprises one or more of the following conductive materials: conductive epoxy, or other suitable material.

In some embodiments, pad 930 is elastomeric. For example, pad 930 may have a Young's modulus which is less than about 50 MPa.

Accordingly, pad 930 absorbs mechanical vibration and shock energy translated from the PCB 900, for example, through leads 760 to MEMS package 720 or to the body 705 of MEMS package 700. For example, in some embodiments, pad 930 prevents or attenuates harmonic or resonant mechanical ringing. Accordingly, the mechanical forces generated on the various portions of the structure of the MEMS package 700 by the mechanical vibration and shock waves are greatly reduced.

Figure 15:
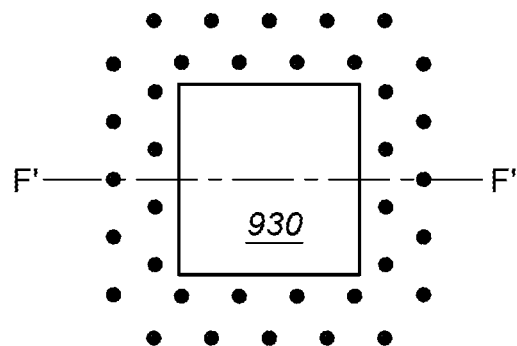
FIG. 15 illustrates a simplified cross-sectional view of the board mounted MEMS package illustrated in FIG. 14.

FIG. 15 illustrates a simplified cross-sectional view of the board mounted MEMS package 700 illustrated in FIG. 14 in a plane defined by the line F-F and perpendicular to the view of FIG. 14, where FIG. 14 is a simplified cross-sectional view of the board mounted MEMS package 700 in a plane defined by the line F'-F' and perpendicular to the figure view of FIG. 15. As understood by those of skill in the art, the principles discussed with reference to FIG. 15 may be applied to other IC packages, with modifications known to those of skill in the art to accommodate the other IC packages.

In the illustrated embodiment, the pad 930 is spaced apart from each of the leads 760 by a substantially identical distance because the lateral surfaces of pad 930 facing leads 760 are substantially planar and are parallel with planes defined by the leads 760. In some embodiments, the lateral surfaces of pad 930 are not planar, but instead are irregular.

An advantage to an irregular lateral surface of pad 930 is that mechanical waves traveling through the structure are less likely to constructively interfere because the resonant pathways and spaces are disturbed or interrupted by the irregular arrangement. Accordingly, the mechanical forces generated on the various portions of the structure by the mechanical waves are attenuated more than if the lateral surfaces of pad 930 facing leads 760 were planar.

To manufacture or assemble the board mounted MEMS package 700 illustrated in FIG. 14, MEMS package 700 is positioned such that leads 760 extend into or through PCB 900. While so positioned, leads 760 are soldered to PCB 900 using techniques understood by those of skill in the art to mechanically and electrically connect leads 760, and therefore MEMS package 700 to PCB 900.

In some embodiments, pad 930 is placed on the body 705 of MEMS package 700 prior to positioning MEMS package 700 such that the leads 760 extend into or through PCB 900. Pad 930 may, for example, be adhered to body 705 using an adhesive. In some embodiments, the adhesive is subsequently removed. Accordingly, in such embodiments, positioning MEMS package 700 such that the leads 760 extend into or through PCB 900 causes pad 930 to contact PCB 900. For example, MEMS package 700 may be positioned such that the pad 930 is compressed between PCB 900 and the body 705 of MEMS package 700. While in this position, leads 760 are soldered to PCB 900 using techniques understood by those of skill in the art.

In some embodiments, pad 930 is placed on the PCB 900 prior to positioning MEMS package 700 such that the leads 760 extend into or through PCB 900. For example, pad 930 may be adhered to PCB 900 using an adhesive. In some embodiments, the adhesive is subsequently removed. Accordingly, in such embodiments, positioning MEMS package 700 such that the leads 760 extend into or through PCB 900 causes pad 930 to contact the body 705 of MEMS package 700. For example, MEMS package 700 may be positioned such that the pad 930 is compressed between PCB 900 and the body 705 of MEMS package 700. While in this position, leads 760 are soldered to PCB 900 using techniques understood by those of skill in the art.

Figure 16:
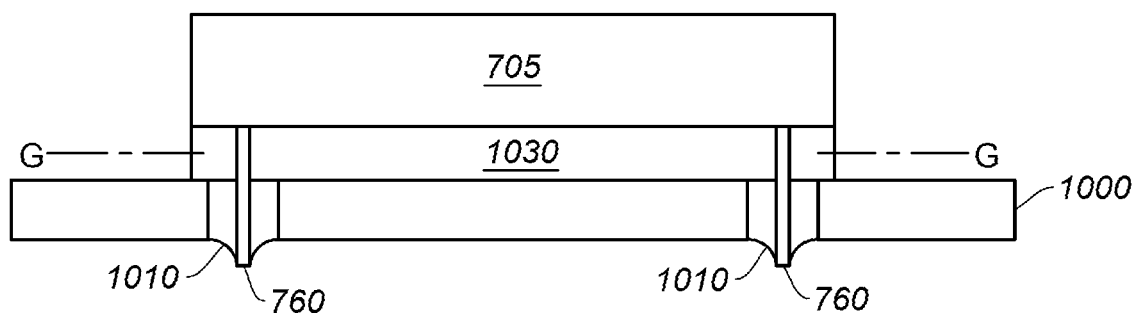
FIG. 16 illustrates a simplified cross-sectional view of the MEMS package shown in FIG. 11 mounted on a printed circuit board (PCB), according to certain embodiments of the invention.

FIG. 16 illustrates a simplified cross-sectional view of the MEMS package 700 shown in FIG. 11 mounted on a printed circuit board (PCB) 1000, according to certain embodiments of the invention. As understood by those of skill in the art, the principles discussed with reference to FIG. 16 may be applied to other IC packages, with modifications known to those of skill in the art to accommodate the other IC packages.

As illustrated, MEMS package 700, comprising body 705 and leads 760, is mechanically and electrically attached to PCB 1000 by solder connections 1010, which are electrically and mechanically connected to both PCB 1000 and the leads 760 of MEMS package 700.

In addition, pad 1030 is between PCB 1000 and MEMS package 700 or the body 705 of MEMS package 700. In some embodiments, pad 1030, or at least a portion of pad 1030 is compressed between PCB 1000 and the MEMS package 700 or the body 705 of MEMS package 700, such that pad 1030 exerts a force on each of PCB 1000 and the MEMS package 700 or the body 705 of MEMS package 700.

In addition, one or more leads 760 extends through pad 1030, such that pad 1030 surrounds each of the leads 760 extending therethrough. In some embodiments, pad 1030 contacts and exerts a force on each of the leads 760 which it surrounds. In some embodiments, pad 1030 contacts and exerts a force on opposite sides of the leads 760 which it surrounds. In some embodiments, pad 1030 contacts and exerts a force on all of the sides or the portions of the sides of the leads 760 which the pad 1030 surrounds.

In some embodiments, pad 1030 comprises or is covered with an adhesive material, such that pad 1030 adheres to either or both of PCB 1000 and MEMS package 700. For example, in some embodiments, pad 1030 comprises one or more of the following adhesive materials: die attach epoxy, or other suitable material.

In some embodiments, at least one or more portions of pad 1030 are not conductive, such that pad 1030 provides electrical insulation between PCB 1000 and MEMS package 700. For example, in some embodiments, pad 1030 comprises one or more of the following non-conductive materials: non-conductive epoxy, or other suitable material.

In some embodiments, at least one or more portions of pad 1030 are conductive, such that pad 1030 provides one or more conductive paths between PCB 1000 and MEMS package 700. For example, in some embodiments, pad 1030 comprises one or more of the following conductive materials: conductive epoxy, or other suitable material.

In some embodiments, pad 1030 is elastomeric. For example, pad 1030 may have a Young's modulus which is less than about 50 MPa.

Accordingly, pad 1030 absorbs mechanical vibration and shock energy translated from the PCB 1000, for example, through leads 760 to MEMS package 720 or to the body 705 of MEMS package 700. Therefore, pad 1030 prevents or attenuates harmonic or resonant mechanical ringing, such that the mechanical forces generated on the various portions of the structure of the MEMS package 700 by the mechanical vibration and shock waves are greatly reduced.

Figure 17:
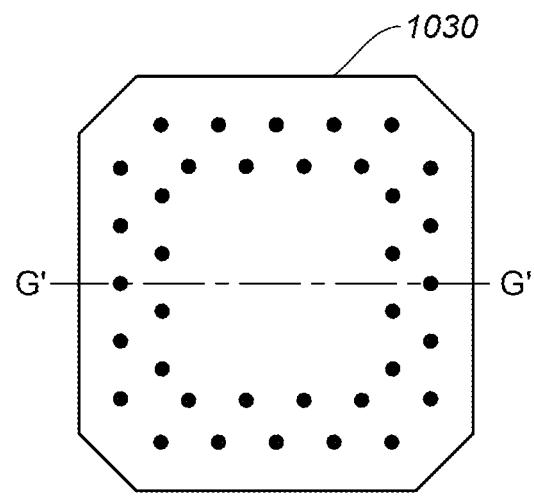
FIG. 17 illustrates a simplified cross-sectional view of the board mounted MEMS package illustrated in FIG. 16.

FIG. 17 illustrates a simplified cross-sectional view of the board mounted MEMS package 700 illustrated in FIG. 16 in a plane defined by the line G-G and perpendicular to the view of FIG. 16, where FIG. 16 is a simplified cross-sectional view of the board mounted MEMS package 700 in a plane defined by the line G'-G' and perpendicular to the figure view of FIG. 17. As understood by those of skill in the art, the principles discussed with reference to FIG. 17 may be applied to other IC packages, with modifications known to those of skill in the art to accommodate the other IC packages.

In the illustrated embodiment, the pad 1030 contacts and exerts a force on each of the leads 760.

In some embodiments, the pad 1030 does not contact one or more of the leads 760. In some embodiments, the arrangement of leads 760 contacted by the pad 1030 among leads 760 not contacted by the pad 1030 is irregular or asymmetric. For example, a pin grid array (PGA) package may be mounted to a PCB where the arrangement of leads 760 contacting the pad 1030 among leads 760 not contacting the pad 1030 is irregular or asymmetric. As understood by those of skill in the art, many irregular or asymmetric arrangements may be used.

An advantage to an irregular or asymmetric arrangement of leads 760 contacted by the pad 1030 among leads 760 not contacted by the pad 1030 is that mechanical waves traveling through the structure are less likely to constructively interfere because the resonant pathways and spaces are disturbed or interrupted by the irregular or asymmetric arrangement of the leads 760 contacted by the pad 1030. Accordingly, the mechanical forces generated on the various portions of the structure by the mechanical waves are attenuated more than if the leads 760 contacted by the pad 1030 among leads 760 not contacted by the pad 1030 were regular or symmetric.

To manufacture or assemble the board mounted MEMS package 700 illustrated in FIG. 16, MEMS package 700 is positioned such that leads 760 extend into or through PCB 900. While so positioned, leads 760 are soldered to PCB 900 using techniques understood by those of skill in the art to mechanically and electrically connect leads 760, and therefore MEMS package 700 to PCB 900.

In some embodiments, pad 1030 is placed on the body 705 of MEMS package 700 prior to positioning MEMS package 700 such that the leads 760 extend into or through PCB 1000. Pad 1030 may, for example, be adhered to body 705 using an adhesive. In some embodiments, the adhesive is subsequently removed. In some embodiments, no adhesive is used. Accordingly, in such embodiments, positioning MEMS package 700 such that the leads 760 extend into or through PCB 1000 causes pad 1030 to contact PCB 1000. For example, MEMS package 700 may be positioned such that the pad 1030 is compressed between PCB 1000 and the body 705 of MEMS package 700. While in this position, leads 760 are soldered to PCB 1000 using techniques understood by those of skill in the art. In some embodiments, placing pad 1030 on body 705 causes one or more leads 760 to pierce pad 1030. In some embodiments, pad 1030 includes holes through which leads 760 extend prior to pad 1030 being placed on body 705. In some embodiments, leads 760 extending through pre-existing holes in pad 1030 do not contact pad 1030 after soldering. In some embodiments, leads 760 extending through pre-existing holes in pad 1030 do contact pad 1030 after soldering.

In some embodiments, pad 1030 is placed on the pins 760 of MEMS package 700 prior to positioning MEMS package 700 such that the leads 760 extend into or through PCB 1000. Pad 1030 may, for example, be adhered to pins 760 using an adhesive. In some embodiments, the adhesive is subsequently removed. In some embodiments, no adhesive is used. In some embodiments, placing pad 1030 on the pins 760 causes a friction fit connection between pad 1030 and the pins 760. In some embodiments, placing pad 1030 on the pins causes one or more pins 760 to pierce or partially pierce pad 1030. Accordingly, in such embodiments, positioning MEMS package 700 such that the leads 760 extend into or through PCB 1000 causes pad 1030 to contact PCB 1000 and body 705 of MEMS package 700. For example, MEMS package 700 may be positioned such that the pad 1030 is compressed between PCB 1000 and the body 705 of MEMS package 700. While in this position, leads 760 are soldered to PCB 1000 using techniques understood by those of skill in the art. In some embodiments, pad 1030 includes holes through or into which leads 760 extend prior to pad 1030 being placed on body 705. In some embodiments, leads 760 extending through pre-existing holes in pad 1030 do not contact pad 1030 after soldering. In some embodiments, leads 760 extending through pre-existing holes in pad 1030 do contact pad 1030 after soldering.

In some embodiments, pad 1030 is placed on the PCB 1000 prior to positioning MEMS package 700 such that the leads 760 extend into or through PCB 1000. For example, pad 1030 may be adhered to PCB 1000 using an adhesive. In some embodiments, the adhesive is subsequently removed. In some embodiments, positioning MEMS package 700 such that the leads 760 extend into or through PCB 1000 causes a friction fit connection between pad 1030 and the pins 760. In some embodiments, positioning MEMS package 700 such that the leads 760 extend into or through PCB 1000 causes one or more pins 760 to pierce or partially pierce or further pierce pad 1030. Accordingly, in such embodiments, positioning MEMS package 700 such that the leads 760 extend into or through PCB 1000 causes pad 1030 to contact PCB 1000 and body 705 of MEMS package 700. For example, MEMS package 700 may be positioned such that the pad 1030 is compressed between PCB 1000 and the body 705 of MEMS package 700. While in this position, leads 760 are soldered to PCB 1000 using techniques understood by those of skill in the art. In some embodiments, pad 1030 includes holes through or into which leads 760 extend prior to pad 1030 being placed on body 705. In some embodiments, leads 760 extending through pre-existing holes in pad 1030 do not contact pad 1030 after soldering. In some embodiments, leads 760 extending through pre-existing holes in pad 1030 do contact pad 1030 after soldering.

Figure 18:
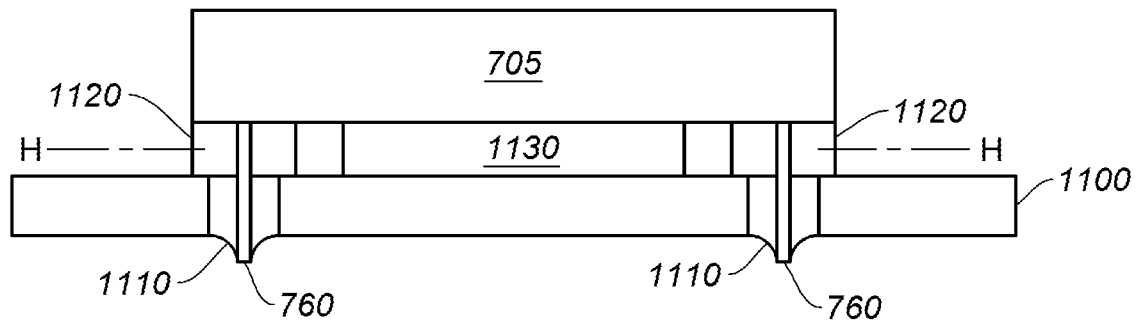
FIG. 18 illustrates a simplified cross-sectional view of the MEMS package shown in FIG. 11 mounted on a printed circuit board (PCB), according to certain embodiments of the invention.

FIG. 18 illustrates a simplified cross-sectional view of the MEMS package 700 shown in FIG. 11 mounted on a printed circuit board (PCB) 1100, according to certain embodiments of the invention. As understood by those of skill in the art, the principles discussed with reference to FIG. 18 may be applied to other IC packages, with modifications known to those of skill in the art to accommodate the other IC packages.

As illustrated, MEMS package 700, comprising body 705 and leads 760, is mechanically and electrically attached to PCB 1100 by solder connections 1110, which are electrically and mechanically connected to both PCB 1100 and the leads 760 of MEMS package 700.

In addition, grommets 1120 each surround one or more of the leads 760 between PCB 1100 and MEMS package 700 or the body 705 of MEMS package 700. In some embodiments, grommets 1120, or at least a portion of each of the grommets 1120 are compressed between PCB 1100 and the MEMS package 700 or the body 705 of MEMS package 700, such that grommets 1120 exert a force on each of PCB 1100 and the MEMS package 700 or the body 705 of MEMS package 700.

In some embodiments, grommets 1120 each contact and exert a force on the lead(s) 760 which they surround. In some embodiments, grommets 1120 each contact and exert a force on opposite sides of the lead(s) 760 which they surround. In some embodiments, grommets 1120 each contact and exert a force on all of the sides or the portions of the sides of the lead(s) 760 which the grommets 1120 surround.

In some embodiments, grommets 1120 are elastomeric. For example, grommets 1128 may have a Young's modulus which is less than about 50 MPa.

In some embodiments, grommets 1120 comprise one or more of the following materials: silicon rubber, EPDM rubber, or other suitable material.

Accordingly, grommets 1120 absorb mechanical vibration and shock energy which would otherwise be translated from the PCB 1100, for example, through leads 760 to MEMS package 720 or to the body 705 of MEMS package 700. For example, in some embodiments, grommets 1120 prevent or attenuate harmonic or resonant mechanical ringing. Accordingly, the mechanical forces generated on the various portions of the structure of the MEMS package 700 by the mechanical vibration and shock waves are greatly reduced.

In addition, pad 1130 is between PCB 1100 and MEMS package 700 or the body 705 of MEMS package 700. In some embodiments, pad 1130, or at least a portion of pad 1130 is compressed between PCB 1100 and the MEMS package 700 or the body 705 of MEMS package 700, such that pad 1130 exerts a force on each of PCB 1100 and the MEMS package 700 or the body 705 of MEMS package 700.

In some embodiments, pad 1130 extends so as to press against and exert a force on one or more of the leads 760. In some embodiments, one or more lateral sides of pad 1130 are spaced apart from the leads 760 nearest thereto, such that the body 705 of MEMS package 700 extends farther than the pad 1130 in a direction from the middle of the body 705 of MEMS package 700 toward the leads 760 along the PCB 1100.

In some embodiments, pad 1130 comprises or is covered with an adhesive material, such that pad 1130 adheres to either or both of PCB 1100 and MEMS package 700. For example, in some embodiments, pad 1130 comprises one or more of the following adhesive materials: die attach epoxy, or other suitable material.

In some embodiments, at least one or more portions of pad 1130 are not conductive, such that pad 1030 provides electrical insulation between PCB 1000 and MEMS package 700. For example, in some embodiments, pad 1030 comprises one or more of the following non-conductive materials: non-conductive epoxy, or other suitable material.

In some embodiments, at least one or more portions of pad 1130 are conductive, such that pad 1130 provides one or more conductive paths between PCB 1100 and MEMS package 700. For example, in some embodiments, pad 1130 comprises one or more of the following conductive materials: conductive epoxy, or other suitable material.

In some embodiments, pad 1130 is elastomeric. For example, pad 1130 may have a Young's modulus which is less than about 50 MPa.

Accordingly, pad 1130 absorbs mechanical vibration and shock energy translated from the PCB 1100, for example, through leads 760 to MEMS package 720 or to the body 705 of MEMS package 700. For example, in some embodiments, pad 1130 prevents or attenuates harmonic or resonant mechanical ringing. Accordingly, the mechanical forces generated on the various portions of the structure of the MEMS package 700 by the mechanical vibration and shock waves are greatly reduced.

Figure 19:
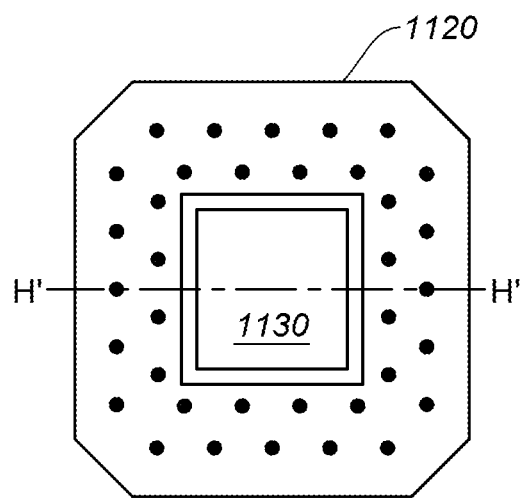
FIG. 19 illustrates a simplified cross-sectional view of the board mounted MEMS package illustrated in FIG. 18.

FIG. 19 illustrates a simplified cross-sectional view of the board mounted MEMS package 700 illustrated in FIG. 18 in a plane defined by the line H-H and perpendicular to the view of FIG. 18, where FIG. 18 is a simplified cross-sectional view of the board mounted MEMS package 700 in a plane defined by the line H'-H' and perpendicular to the figure view of FIG. 19. As understood by those of skill in the art, the principles discussed with reference to FIG. 19 may be applied to other IC packages, with modifications known to those of skill in the art to accommodate the other IC packages.

In the illustrated embodiment, all leads 760 contact grommet 1120. In alternative embodiments, not all of the leads 760 contact grommet 1120. In addition, the grommet 1120 is a compound grommet, where grommet 1120 contacts and/or surrounds multiple leads 760, in contrast to grommets 820, which each contact a single lead 760.

In some embodiments, the grommet 1120 does not contact one or more of the leads 760. In some embodiments, the arrangement of leads 760 contacted by the grommet 1120 among leads 760 not contacted by the grommet 1120 is irregular or asymmetric. For example, a pin grid array (PGA) package may be mounted to a PCB where the arrangement of leads 760 contacting the grommet 1120 among leads 760 not contacting the grommet 1120 is irregular or asymmetric. As understood by those of skill in the art, many irregular or asymmetric arrangements may be used.

An advantage to an irregular or asymmetric arrangement of leads 760 contacting grommet 1120 among leads 760 not contacting grommet 1120 is that mechanical waves traveling through the structure are less likely to constructively interfere because the resonant pathways and spaces are disturbed or interrupted by the irregular or asymmetric arrangement of the grommet 1120. Accordingly, the mechanical forces generated on the various portions of the structure by the mechanical waves are attenuated more than if the leads 760 contacting grommet 1120 among leads 760 not contacting grommet 1120 were regular or symmetric.

In the illustrated embodiment, the pad 1130 is spaced apart from each of the leads 760 by a substantially identical distance because the lateral surfaces of pad 1130 facing leads 760 are substantially planar and are parallel with planes defined by the leads 760. In some embodiments, the lateral surfaces of pad 1130 are not planar, but instead are irregular.

An advantage to an irregular lateral surface of pad 1130 is that mechanical waves traveling through the structure are less likely to constructively interfere because the resonant pathways and spaces are disturbed or interrupted by the irregular arrangement. Accordingly, the mechanical forces generated on the various portions of the structure by the mechanical waves are attenuated more than if the lateral surfaces of pad 1130 facing leads 760 were planar.

To manufacture or assemble the board mounted MEMS package 700 illustrated in FIG. 18, MEMS package 700 is positioned such that leads 760 extend into or through PCB 1100. While so positioned, leads 760 are soldered to PCB 1100 using techniques understood by those of skill in the art to mechanically and electrically connect leads 760, and therefore MEMS package 700 to PCB 1100.

In some embodiments, grommets 1120 are placed on the leads 760 prior to positioning MEMS package 700 such that the leads 760 extend into or through PCB 1100. Accordingly, in such embodiments, positioning MEMS package 700 such that the leads 760 extend into or through PCB 1100 causes grommets 1120 to contact PCB 1100. For example, MEMS package 700 may be positioned such that the grommets 1120 surrounding leads 760 are compressed between PCB 1100 and the body 705 of MEMS package 700. While in this position, leads 760 are soldered to PCB 1100 using techniques understood by those of skill in the art.

In some embodiments, grommets 1120 are placed on the PCB 1100 prior to positioning MEMS package 700 such that the leads 760 extend into or through PCB 1100. For example, grommets 1120 may be placed on PCB 1100 such that holes in the grommets 820 align with holes in PCB 1100 into or through which leads 760 are to be inserted. Grommets 1120 may, for example, be adhered to PCB 1100 using an adhesive. In some embodiments, the adhesive is subsequently removed. Accordingly, in such embodiments, positioning MEMS package 700 such that the leads 760 extend into or through PCB 1100 causes the leads 760 to be inserted into corresponding grommets 1120 which are previously positioned on PCB 1100, and causes grommets 1120 to contact the body 705 of MEMS package 700. For example, MEMS package 700 may be positioned such that the grommets 1120 surrounding leads 760 are compressed between PCB 1100 and the body 705 of MEMS package 700. While in this position, leads 760 are soldered to PCB 1100 using techniques understood by those of skill in the art.

In some embodiments, grommets 1120 are placed on the pins 760 of MEMS package 700 prior to positioning MEMS package 700 such that the leads 760 extend into or through PCB 1100. Grommets 1120 may, for example, be adhered to pins 760 using an adhesive. In some embodiments, the adhesive is subsequently removed. In some embodiments, no adhesive is used. In some embodiments, placing grommets 1120 on the pins 760 causes a friction fit connection between grommets 1120 and the pins 760. In some embodiments, placing grommets 1120 on the pins causes one or more pins 760 to pierce or partially pierce grommets 1120. Accordingly, in such embodiments, positioning MEMS package 700 such that the leads 760 extend into or through PCB 1100 causes grommets 1120 to contact PCB 1100 and body 705 of MEMS package 700. For example, MEMS package 700 may be positioned such that the grommets 1120 are compressed between PCB 1100 and the body 705 of MEMS package 700. While in this position, leads 760 are soldered to PCB 1100 using techniques understood by those of skill in the art. In some embodiments, grommets 1120 includes holes through or into which leads 760 extend prior to pad 1130 being placed on body 705. In some embodiments, leads 760 extending through pre-existing holes in grommets 1120 do not contact pad 1130 after soldering. In some embodiments, leads 760 extending through pre-existing holes in grommets 1120 do contact grommets 1120 after soldering.

In some embodiments, pad 1130 is placed on the body 705 of MEMS package 700 prior to positioning MEMS package 700 such that the leads 760 extend into or through PCB 1100. Pad 1130 may, for example, be adhered to body 705 using an adhesive. In some embodiments, the adhesive is subsequently removed. Accordingly, in such embodiments, positioning MEMS package 700 such that the leads 760 extend into or through PCB 1100 causes pad 1130 to contact PCB 1100. For example, MEMS package 700 may be positioned such that the pad 1130 is compressed between PCB 1100 and the body 705 of MEMS package 700. While in this position, leads 760 are soldered to PCB 1100 using techniques understood by those of skill in the art.

In some embodiments, pad 1130 is placed on the PCB 1100 prior to positioning MEMS package 700 such that the leads 760 extend into or through PCB 1100. For example, pad 1130 may be adhered to PCB 1100 using an adhesive. In some embodiments, the adhesive is subsequently removed. Accordingly, in such embodiments, positioning MEMS package 700 such that the leads 760 extend into or through PCB 1100 causes pad 1130 to contact the body 705 of MEMS package 700. For example, MEMS package 700 may be positioned such that the pad 1130 is compressed between PCB 1100 and the body 705 of MEMS package 700. While in this position, leads 760 are soldered to PCB 1100 using techniques understood by those of skill in the art.

The features of the embodiments described herein may be applied to surface mount package arrangements, as understood by those of skill in the art. For example, a surface mount package may have a pad between the package and the board to which it is mounted. Additionally or alternatively, a surface mount package may have one or more grommets through which one or more pins extend from the package to the board to which the package is mounted.

In some embodiments, a grommet or another mechanical absorbing structure may be attached to a package already mounted. For example, a grommet or another mechanical absorbing structure may be attached to an exposed surface of the mountain package using, for example, double-sided adhesive tape, epoxy, or another adhesive. In some embodiments, the grommet or other mechanical absorbing structure contacts the pins of the mounted package.

Any of the embodiments of packaging arrangements described herein may be modified to include features of the other embodiments. For example, any of the embodiments of die attach discussed herein may additionally or alternatively have attributes of any of the other embodiments of die attach discussed herein. Additionally or alternatively, any of the embodiments of grommets discussed herein may additionally or alternatively have attributes of any of the other embodiments of grommets discussed herein. Additionally or alternatively, any of the embodiments of pads discussed herein may additionally or alternatively have attributes of any of the other embodiments of pads discussed herein.

Furthermore, any of the embodiments of die attach discussed herein may additionally or alternatively have attributes of any of the embodiments of grommets and pads discussed herein. Additionally or alternatively, any of the embodiments of grommets discussed herein may additionally or alternatively have attributes of any of the embodiments of die attach and pads discussed herein. Additionally or alternatively, any of the embodiments of pads discussed herein may additionally or alternatively have attributes of any of the embodiments of die attach and grommets discussed herein.

Furthermore, any of the embodiments of die attach discussed herein may additionally or alternatively have attributes of any of the embodiments of grommets and pads discussed herein. Additionally or alternatively, any of the embodiments of grommets discussed herein may additionally or alternatively have attributes of any of the embodiments of die attach and pads discussed herein. Additionally or alternatively, any of the embodiments of pads discussed herein may additionally or alternatively have attributes of any of the embodiments of die attach and grommets discussed herein.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if something is intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

What is claimed is:

1. An optical micro-electromechanical system (MEMS) system, comprising:
   a printed circuit board (PCB);

a MEMS optical integrated circuit (IC) package mounted to the PCB, the IC package comprising:
a MEMS optical die; and
a plurality of leads electrically and mechanically connected to the MEMS optical die and to the PCB;
one or more elastomeric grommets contacting one or more of the leads, wherein the grommets are configured to absorb mechanical vibration energy from the contacted leads; and
an elastomeric pad contacting the IC package and the PCB, wherein the pad is configured to absorb mechanical vibration energy from the IC package and the PCB.

2. The optical MEMS package of claim 1, wherein the grommets further contact the IC package and the PCB, and wherein the grommets are further configured to absorb mechanical vibration energy from the IC package and the PCB.

3. The optical MEMS package of claim 1, wherein at least one of the grommets contacts a plurality of leads.

4. The optical MEMS package of claim 1, wherein at least one of the grommets comprises one or more holes, wherein each hole surrounds one of the leads.

5. The optical MEMS package of claim 1, wherein the grommets are spaced apart from the pad.

6. The optical MEMS package of claim 1, wherein the grommets contact the pad.

7. The optical MEMS package of claim 1, wherein the grommets are formed by a portion of the pad.

8. A LiDAR system, comprising:
a pulsed light source, comprising:
a printed circuit board (PCB);
a MEMS integrated circuit (IC) package mounted to the PCB, the IC package comprising:
a MEMS optical die sensitive to mechanical vibration and configured to provide pulsed light; and
a plurality of leads electrically and mechanically connected to the PCB;
one or more elastomeric grommets contacting one or more of the leads, wherein
the grommets are configured to absorb mechanical vibration energy from the contacted leads;
a light detector configured to detect light from the pulsed light source; and
an elastomeric pad contacting the IC package and the PCB, wherein the pad is configured to absorb mechanical vibration energy from the IC package and the PCB.

9. The LiDAR system of claim 8, wherein the grommets further contact the IC package and the PCB, and wherein the grommets are further configured to absorb mechanical vibration energy from the IC package and the PCB.

10. The LiDAR system of claim 8, wherein at least one of the grommets contacts a plurality of leads.

11. The LiDAR system of claim 8, wherein at least one of the grommets comprises one or more holes, wherein each hole surrounds one of the leads.

12. The LiDAR system of claim 8, wherein the grommets are spaced apart from the pad.

13. The LiDAR system of claim 8, wherein the grommets contact the pad.

14. The LiDAR system of claim 8, wherein the grommets are formed by a portion of the pad.

15. A method of manufacturing an optical micro-electromechanical system (MEMS) system, comprising:
placing a MEMS optical integrated circuit (IC) package on a printed circuit board (PCB), the IC package comprising:
a MEMS optical die, and
a plurality of leads electrically and mechanically connected to the MEMS optical die,
placing one or more elastomeric grommets on the PCB;
causing the grommets to contact one or more of the leads, wherein the grommets are configured to absorb mechanical vibration energy from the contacted leads; and
placing an elastomeric pad between the MEMS optical IC package and the PCB, wherein the pad contacts the MEMS optical IC package and the PCB.

16. The method of claim 15, wherein placing the MEMS optical IC package on the PCB comprises placing the grommets on the PCB.

17. The method of claim 15, wherein placing the MEMS optical IC package on the PCB causes the grommets to contact one or more of the leads.

* * * * *